US012754464B2

(12) United States Patent
Hirai

(10) Patent No.: US 12,754,464 B2
(45) Date of Patent: Oct. 6, 2026

(54) PROJECTOR WITH IMPROVED CONFIGURATION OF COOLING APPARATUS

(71) Applicant: SEIKO EPSON CORPORATION, Tokyo (JP)

(72) Inventor: Jun Hirai, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 567 days.

(21) Appl. No.: 18/174,785

(22) Filed: Feb. 27, 2023

(65) Prior Publication Data

US 2023/0273511 A1 Aug. 31, 2023

(30) Foreign Application Priority Data

Feb. 28, 2022 (JP) ................................ 2022-030130

(51) Int. Cl.
*G03B 21/16* (2006.01)
*G03B 21/20* (2006.01)
*H05K 7/20* (2006.01)

(52) U.S. Cl.
CPC ......... *G03B 21/16* (2013.01); *G03B 21/2013* (2013.01); *H05K 7/20145* (2013.01); *H05K 7/20172* (2013.01)

(58) Field of Classification Search
CPC .............................. G03B 21/16; H04N 9/3144
See application file for complete search history.

(56) References Cited

U.S. PATENT DOCUMENTS

2002/0191158 A1* 12/2002 Koyama .............. H04N 9/3105 348/E5.143
2004/0032569 A1* 2/2004 Takezawa ............ H04N 9/3105 353/31
2005/0088627 A1* 4/2005 Gishi ...................... F21V 29/67 353/57
2008/0246896 A1* 10/2008 Zheng .................. H04N 9/3102 349/5
2008/0246925 A1* 10/2008 Zheng .................... G03B 21/16 353/58

(Continued)

FOREIGN PATENT DOCUMENTS

JP 2001-356406 A 12/2001
JP 2013041135 A * 2/2013

(Continued)

*Primary Examiner* — Bao-Luan Q Le
(74) *Attorney, Agent, or Firm* — Oliff PLC

(57) ABSTRACT

A projector includes an image formation apparatus including first to third light modulators and cooling apparatus. The cooling apparatus includes a first duct and a first centrifugal fan according to the first light modulator, a second duct and a second centrifugal fan according to the second light modulator, and a third duct and a third centrifugal fan according to the third light modulator. The first to third centrifugal fans are each so oriented that the angle between an imaginary plane defined by the first and second directions and an intake surface of the centrifugal fan is greater than or equal to 0° but smaller than or equal to 45°. The second centrifugal fan is disposed at a position shifted in a third direction from the first centrifugal fan, and a portion of the second duct overlaps with a portion of the first centrifugal fan when viewed in the third direction.

17 Claims, 21 Drawing Sheets

(56) References Cited

U.S. PATENT DOCUMENTS

2008/0246929 A1* 10/2008 Mao .................... G03B 21/16 353/119
2008/0252858 A1* 10/2008 Zheng .................... G03B 21/16 353/58
2008/0252859 A1* 10/2008 Nagahata .............. G03B 21/16 353/61
2009/0040470 A1* 2/2009 Fukui .................... G03B 21/16 353/58
2011/0075109 A1* 3/2011 Wu ........................ G03B 21/16 353/58
2011/0075110 A1* 3/2011 Liang .................... G03B 21/16 353/58
2011/0075117 A1* 3/2011 Adachi ................ G03B 21/208 353/119
2011/0141440 A1* 6/2011 Okada .................... G03B 21/16 353/57
2011/0273656 A1* 11/2011 Park ...................... G03B 21/16 165/104.34
2012/0075595 A1* 3/2012 Yamamoto ............ G03B 21/16 353/57
2016/0301901 A1* 10/2016 Ishii .................... H04N 9/3144
2016/0353067 A1* 12/2016 Kadotani ............ H04N 9/3144
2017/0104965 A1* 4/2017 Kadotani ............ G03B 21/142
2019/0155133 A1 5/2019 Hasegawa et al.
2021/0157221 A1* 5/2021 Kawase .............. G03B 21/006
2021/0203891 A1* 7/2021 Kawase ................ G03B 21/16
2023/0216994 A1* 7/2023 Hirasawa .............. G03B 21/14 353/52

FOREIGN PATENT DOCUMENTS

JP 2016-218383 A 12/2016
WO 2018/042813 A1 3/2018

* cited by examiner

PROJECTOR WITH IMPROVED CONFIGURATION OF COOLING APPARATUS

The present application is based on, and claims priority from JP Application Serial Number 2022-030130, filed Feb. 28, 2022, the disclosure of which is hereby incorporated by reference herein in its entirety.

BACKGROUND

1. Technical Field

The present disclosure relates to a projector.

2. Related Art

There has been a known projector including a light source, a light modulator that modulates the light outputted from the light source, and a projection optical apparatus that projects the light modulated by the light modulator. As a projector of this type, there is a known projector including a plurality of light modulators and a plurality of cooling fans (see JP-A-2016-218383 and JP-A-2001-356406, for example).

The projector described in JP-A-2016-218383 is provided with light modulators including transmissive liquid crystal panels in accordance with R, G, and B light to which the light outputted from a light source is separated. The plurality of cooling fans are each a sirocco fan that supplies the corresponding one of the plurality of light modulators with cooling air via a duct member. Specifically, out of the plurality of cooling fans, a cooling fan for R light supplies the light modulator for R light with the cooling air via a duct member, the cooling fan for G light supplies the light modulator for G light with the cooling air via a duct member, and the cooling fan for B light supplies the light modulator for B light with the cooling air via a duct member.

The projector described in JP-A-2001-356406 includes a lamp cooling system that sends cooling air to a light source lamp and a panel cooling system that sends cooling air to liquid crystal panels as the light modulators. The lamp cooling system includes two cooling fans arranged in parallel to each other at a first opening formed in one of the sidewall surfaces of a housing, and the air outside the projector is forcibly sent as the cooling air via a first opening as an air inlet into the projector. The panel cooling system includes two cooling fans provided adjacent and parallel to each other along a side surface of the housing. The cooling fans are each formed of an axial fan.

In the projector described in JP-A-2016-218383, however, the cooling fans are so disposed separately from each other when viewed in a first direction that the intake port of each of the cooling fans faces the first direction. The configuration described above allows reduction in the dimension of the projector along the first direction, but has a problem of a possible increase in the area of the projector's surface perpendicular to the first direction.

On the other hand, the projector described in JP A-2001-356406, in which the axial fans are vertically disposed, allows reduction in the footprint of the projector. When the axial fans are vertically disposed, however, large vibration is likely to propagate from the axial fans to the projector. The vibration having reached the projection lens therefore causes a shake of an image projected via the projection lens, large noise, and other problems.

There has therefore been a demand for a configuration that allows reduction in the footprint of the projector with vibration reduced.

SUMMARY

A projector according to a first aspect of the present disclosure includes a light source apparatus that outputs light containing first color light, second color light, and third color light, an image formation apparatus including a first light modulator that modulates the first color light, a second light modulator that modulates the second color light, a third light modulator that modulates the third color light, and a color combiner that combines the modulated first color light, second color light, and third color light with one another into image light and outputs the image light, a projection optical apparatus that includes an optical path changer, receives the image light in a first direction from the image formation apparatus, guides the incident image light along the first direction, changes a direction of an optical path of the image light via the optical path changer to a second direction that intersects with the first direction, and then projects the image light, and a cooling apparatus. The cooling apparatus includes a first duct provided in accordance with the first light modulator, a first centrifugal fan that has an intake surface and delivers a cooling gas into the first duct, a second duct provided in accordance with the second light modulator, a second centrifugal fan that has an intake surface and delivers the cooling gas into the second duct, a third duct provided in accordance with the third light modulator, and a third centrifugal fan that has an intake surface and delivers the cooling gas into the third duct. The first, second, and third centrifugal fans are disposed in a region defined by the image formation apparatus and the projection optical apparatus and each so oriented that an angle between an imaginary plane defined by the first and second directions and the intake surface is greater than or equal to 00 but smaller than or equal to 45°. The second centrifugal fan is disposed at a position shifted from the first centrifugal fan in a third direction that intersects with the first and second directions. A portion of the second duct overlaps with a portion of the first centrifugal fan when viewed in the third direction.

A projector according to a second aspect of the present disclosure includes a light source apparatus that outputs light containing first color light, second color light, and third color light, an image formation apparatus including a first light modulator that modulates the first color light, a second light modulator that modulates the second color light, a third light modulator that modulates the third color light, and a color combiner that combines the modulated first color light, second color light, and third color light with one another into image light and outputs the image light, a projection optical apparatus that includes an optical path changer, receives the image light in a first direction from the image formation apparatus, guides the incident image light along the first direction, changes a direction of an optical path of the image light via the optical path changer to a second direction that intersects with the first direction, and then projects the image light, and a cooling apparatus. The cooling apparatus includes a first duct provided in accordance with the first light modulator, a first centrifugal fan that has an intake surface and delivers a cooling gas into the first duct, a second duct provided in accordance with the second light modulator, a second centrifugal fan that has an intake surface and delivers the cooling gas into the second duct, a third duct provided in accordance with the third light modulator, and a third centrifugal fan that has an intake surface and delivers the cooling gas into the third duct. The first, second, and third centrifugal fans are disposed in a region defined by the image formation apparatus and the projection optical apparatus. The first and second centrifugal fans are each so oriented that an angle between an imaginary plane defined by the first and second directions and the intake surface is greater than or equal to 0° but smaller than or equal to 45°. The third centrifugal fan is so oriented that an angle between the imaginary plane defined by the first and second directions and the intake surface is greater than 45° but smaller than or equal to 90°. The second centrifugal fan is disposed at a position shifted from the first centrifugal fan in a third direction that intersects with the first and second directions. A portion of the second duct overlaps with a portion of the first centrifugal fan when viewed in the third direction.

DESCRIPTION OF EXEMPLARY EMBODIMENTS

An embodiment of the present disclosure will be described below with reference to the drawings.

Schematic Configuration of Projector

Figure 1:
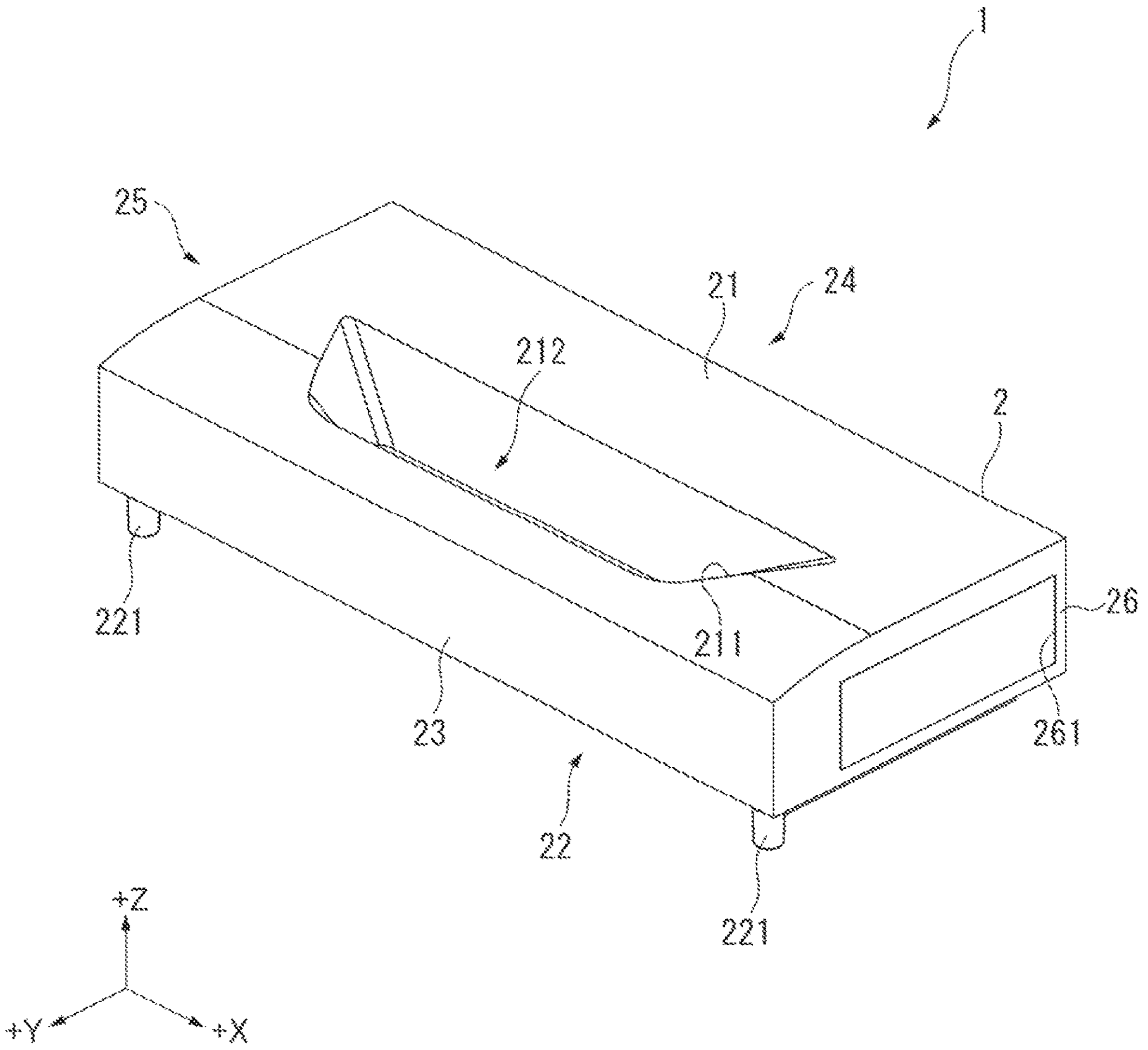
FIG. 1 is a perspective view showing a projector according to an embodiment.
Figure 2:
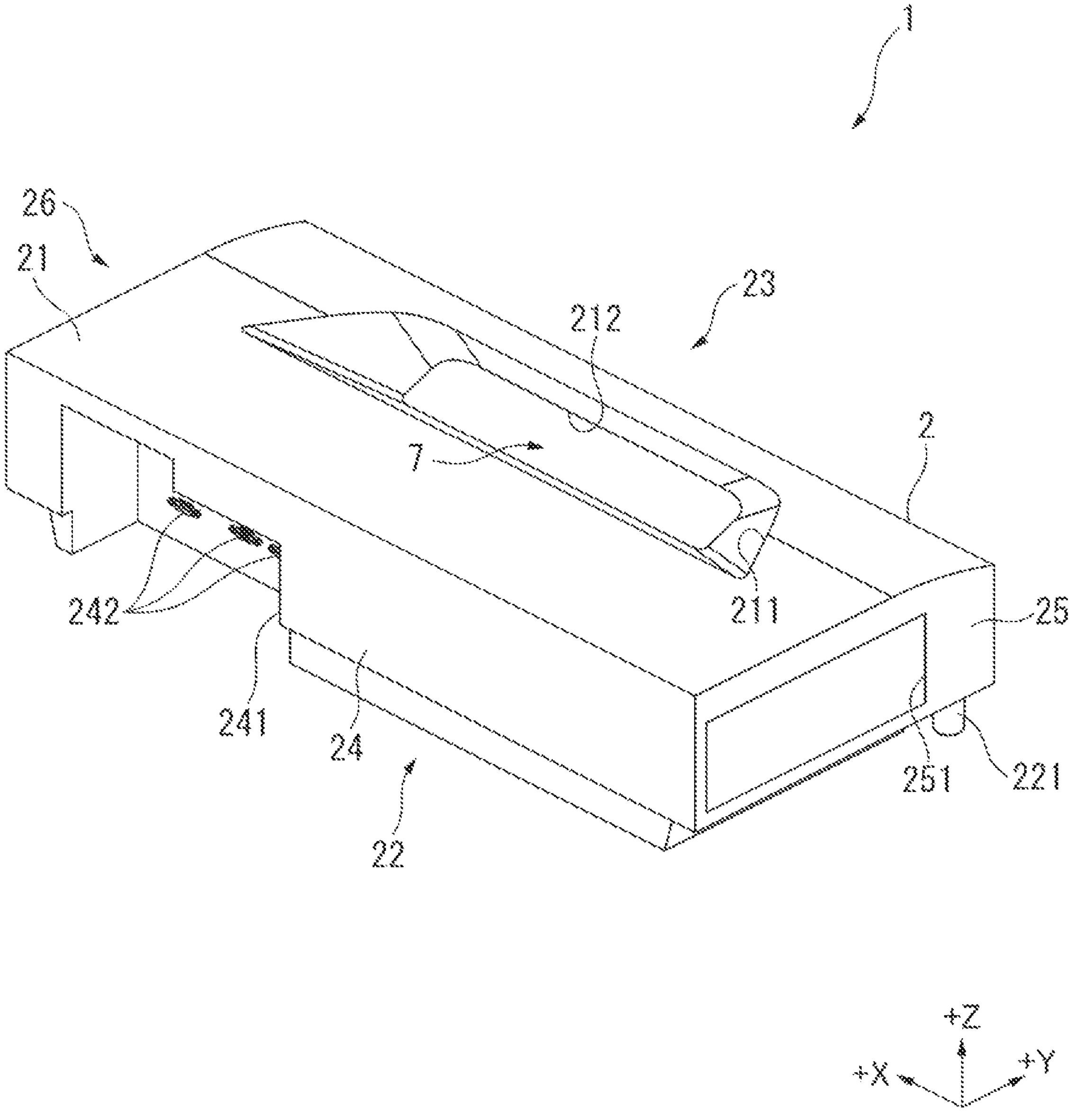
FIG. 2 is another perspective view showing the projector according to the embodiment.

FIGS. 1 and 2 are perspective views showing the exterior appearance of a projector 1 according to the present embodiment. In detail, FIG. 1 is a perspective view of the projector 1 viewed from the side facing a front surface 23, and FIG. 2 is a perspective view of the projector 1 viewed from the side facing a rear surface 24.

The projector 1 according to the present embodiment is a projection apparatus that modulates the light outputted from a light source to generate image light according to image information and projects the generated image light onto a projection receiving surface, such as a screen. The projector 1 includes an exterior enclosure 2, which forms the exterior of the projector 1, as shown in FIGS. 1 and 2.

Configuration of Exterior Enclosure

The exterior enclosure 2 houses an image projection apparatus 4 and a cooling apparatus 8, as well as a controller, a power supply, and other components none of which is shown. The exterior enclosure 2 is formed in a substantially box-like shape and has a top surface 21, a bottom surface 22, the front surface 23, the rear surface 24, a left side surface 25, and a right side surface 26.

In the following description, three directions perpendicular to one another are called directions +X, +Y, and +Z. The direction +X is the direction from the left side surface 25 toward the right side surface 26, the direction +Y is the direction from the rear surface 24 toward the front surface 23, and the direction +Z is the direction from the bottom surface 22 toward the top surface 21. The direction +Z corresponds to a first direction, the direction +X corresponds to a second direction, and the direction +Y corresponds to a third direction. Although not shown, the opposite direction of the direction +X is called a direction −X, the opposite direction of the direction +Y is called a direction −Y, and the opposite direction of the direction +Z is called a direction −Z.

That is, the top surface 21 and the bottom surface 22 are opposite from each other in the direction +Z. The front surface 23 and the rear surface 24 are opposite from each other in the direction +Y. The left side surface 25 and the right side surface 26 are opposite from each other in the direction +X.

The top surface 21 is a surface that faces upward when the projector 1 is installed at an installation surface. The top surface 21 has a recess 211 recessed toward the bottom surface 22 and a projection port 212 provided at the bottom of the recess 211. The projection port 212 is an opening through which the image light projected from a projection optical apparatus 7 passes. The projection optical apparatus 7 will be described later.

The rear surface 24 has a recess 241 recessed toward the front surface 23 and a plurality of terminals 242 provided at the bottom of the recess 241, as shown in FIG. 2.

The left side surface 25 has an opening 251. In the present embodiment, the opening 251 functions as a discharge port via which a cooling gas having cooled cooling targets in the exterior enclosure 2 is discharged.

The right side surface 26 has an opening 261, as shown in FIG. 1. In the present embodiment, the opening 261 functions as an introduction port via which a gas outside the exterior enclosure 2 is introduced as the cooling gas into the exterior enclosure 2. Although not shown, the opening 261 is provided with a filter that removes dust contained in the air passing through the opening 261.

Figure 3:
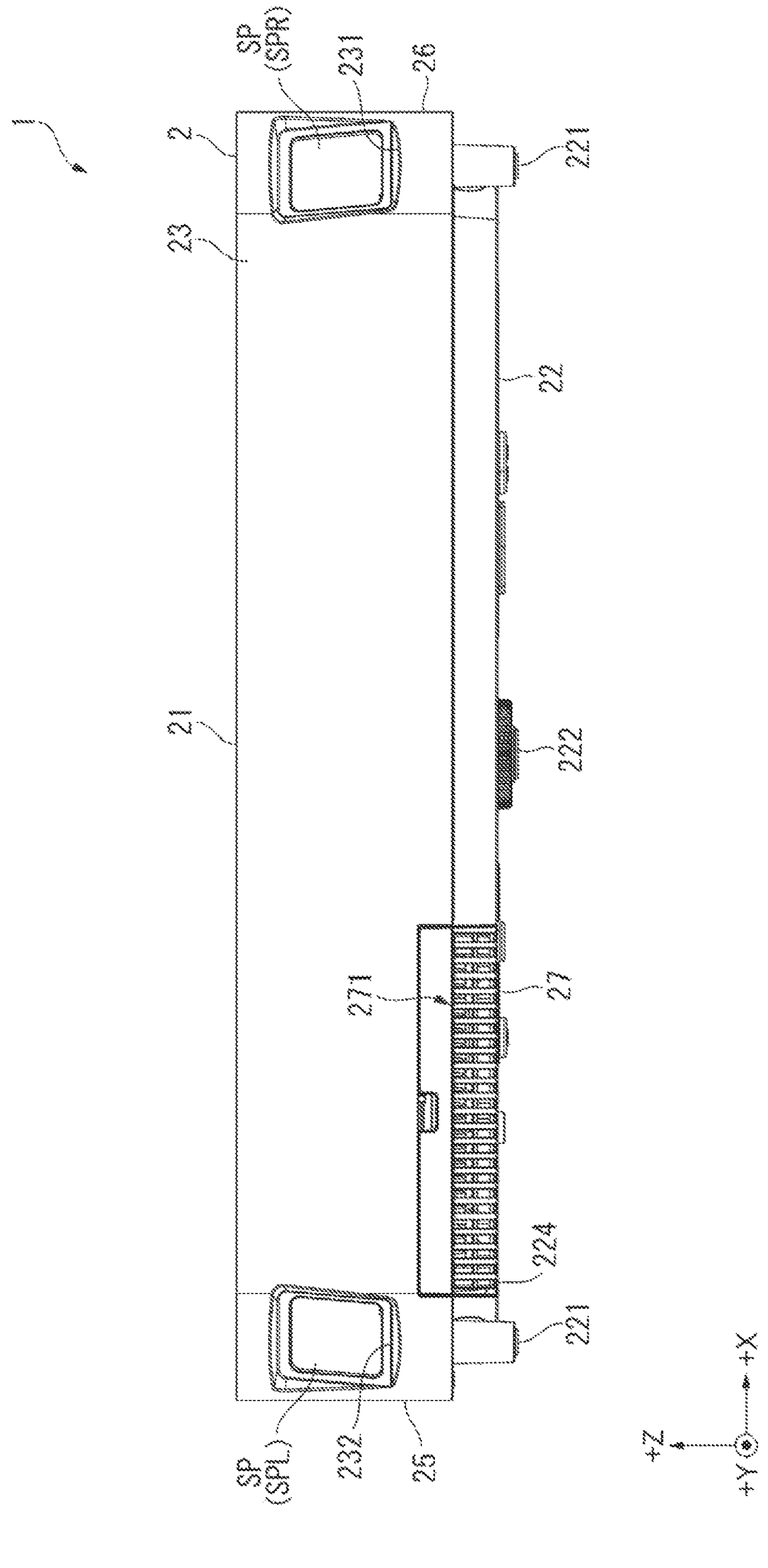
FIG. 3 shows a front surface of an exterior enclosure in the embodiment.

FIG. 3 is a front view of the projector 1 and shows the front surface 23.

The front surface 23 has openings 231 and 232, which expose a pair of loudspeakers SP (SPR and SPL) provided in the exterior enclosure 2. The opening 231 is provided in the vicinity of the end facing the right side surface 26 and exposes the right loudspeaker SPR. The opening 232 is provided in the vicinity of the end facing the left side surface 25 and exposes the left loudspeaker SPL.

Figure 4:
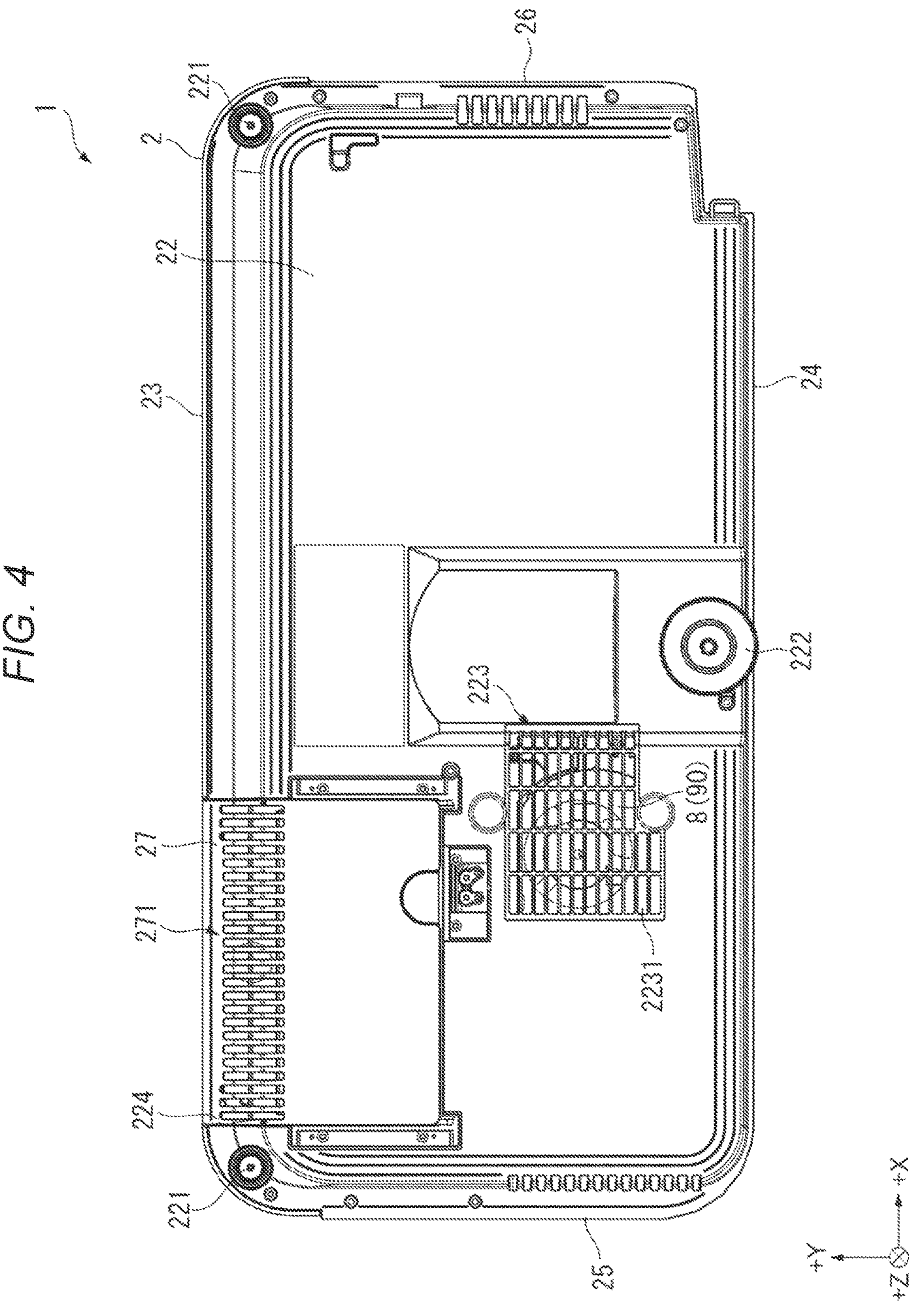
FIG. 4 shows a bottom surface of the exterior enclosure in the embodiment.

FIG. 4 is a bottom view of the projector 1 and shows the bottom surface 22.

The bottom surface 22 faces the installation surface. The bottom surface 22 is provided with a plurality of fixed legs 221, which are in contact with the installation surface, a movable leg 222, an introduction port 223, and a recess 224.

The plurality of fixed legs 221 are provided at opposite end portions of the bottom surface 22 that are shifted toward the front surface 23.

The movable leg 222 is provided at the center of an end portion of the bottom surface 22 that is shifted toward the rear surface 24. The movable leg 222 is provided so as to be capable of protruding and retracting in the direction perpendicular to the bottom surface 22. When the movable leg 222 is caused to protrude from the bottom surface 22, the bottom 22 inclines with respect to the installation surface. The thus configured movable leg 222 adjusts the projection position, on the projection receiving surface, where the image light projected via the top surface 21 is projected.

The introduction port 223 is provided at a position, on the bottom surface 22, that is shifted from the center toward the left side surface 25 and the rear side surface 24. The introduction port 223 introduces the air outside the exterior enclosure 2 as the cooling gas into the exterior enclosure 2. A light source fan 90, which will be described later, is disposed at a position, in the exterior enclosure 2, according to the introduction port 223 in such a way that an intake surface of the light source fan 90 faces the introduction port 223. An air filter 2231 is provided at the introduction port 223. That is, the exterior enclosure 2 has the introduction port 223 as a second introduction port, and the air filter 2231 as a second filter. The light source fan 90 sucks the air outside the exterior enclosure 2 as a cooling gas via the air filter 2231.

The recess 224 is formed at a position, on the bottom surface 22, that is shifted from the center toward the left side surface 25 so as to cover a portion of the front surface 23. An intake cover 27 is attached to the recess 224. That is, the exterior enclosure 2 includes the intake cover 27 attached to the recess 224.

The intake cover 27 is disposed so as to cover a portion of the bottom surface 22 and a portion of the front surface 23, as shown in FIGS. 3 and 4. In detail, the intake cover 27 is inserted from the side facing the front surface 23 into the recess 224 and disposed there. The intake cover 27 has an opening 271, which opens toward the front surface 23, and the air outside the exterior enclosure 2 is introduced as the cooling gas into the recess 224 via the opening 271.

Figure 5:
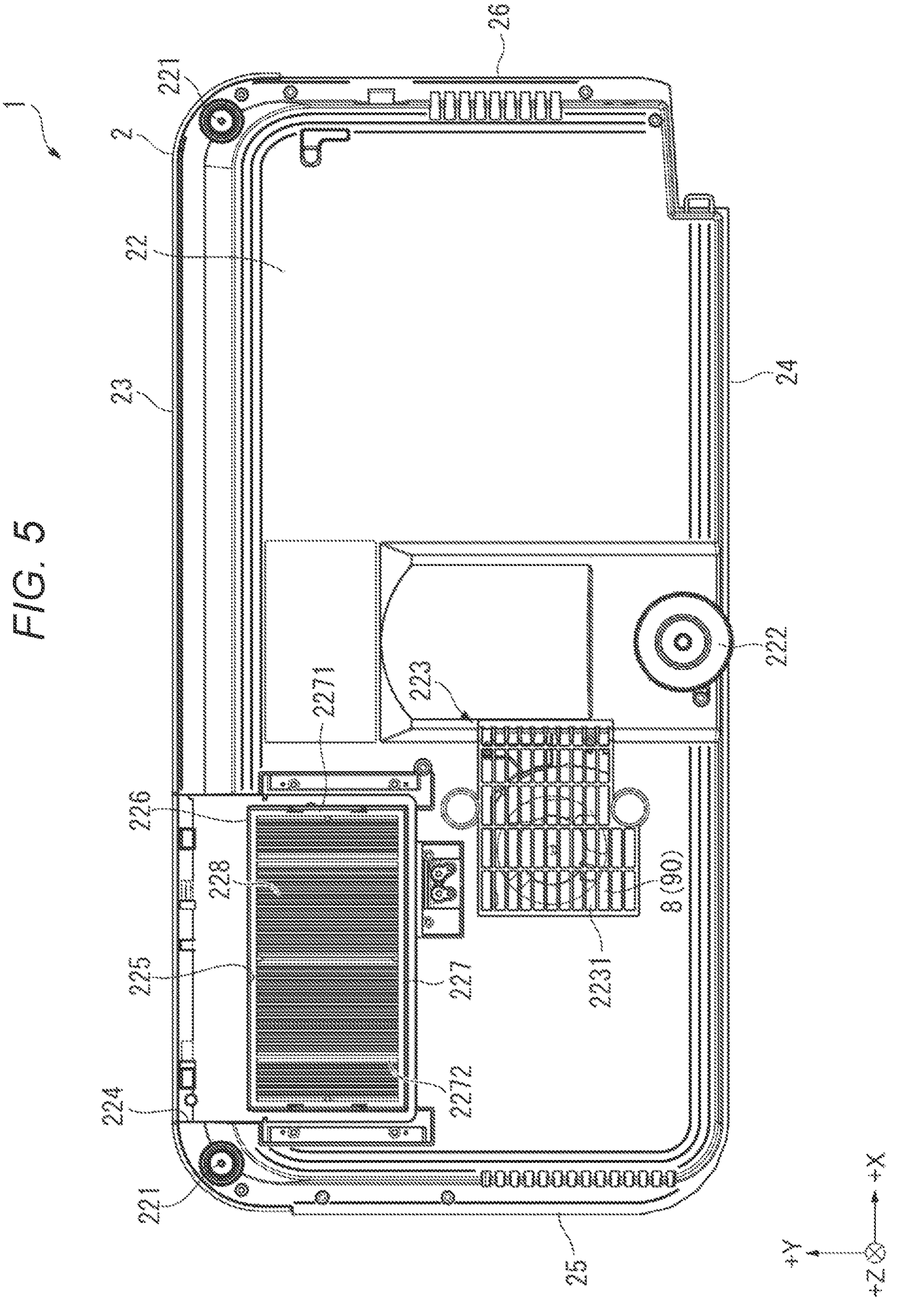
FIG. 5 shows the bottom surface with an intake cover removed in the embodiment.

FIG. 5 shows the bottom surface 22 with the intake cover 27 removed.

The bottom of the recess 224 is provided with an introduction port 225, as shown in FIG. 5. That is, the bottom surface 22 has the introduction port 225 provided at the bottom of the recess 224.

The introduction port 225 is formed in a substantially oblong shape elongated in the direction along the front surface 23 when viewed from a position facing the bottom surface 22. An air filter 226 as a first filter is attached to the introduction port 225. That is, the exterior enclosure 2 has the introduction port 225 as a first introduction port, and the air filter 226 as the first filter.

The air filter 226 includes a frame 227 and a filter section 228 attached to the frame 227.

The frame 227 includes a rectangular frame section 2271 elongated in the direction +X and a parting section 2272 provided at a position shifted in the direction −X from the center, of the frame section 2271, in the direction +X. The parting section 2272 extends along the direction +Y to divide the frame 227 and in turn the region of the air filter 226 into two portions.

The filter section 228 collects dust contained in the gas passing therethrough.

As will be described later in detail, four centrifugal fans 81B, 81R, 81G, and 81L are provided in the exterior enclosure 2 in accordance with the introduction port 225. The centrifugal fans 81B, 81R, 81G, and 81L each have an intake surface that faces the introduction port 225.

Internal Configuration of Projector

Figure 6:
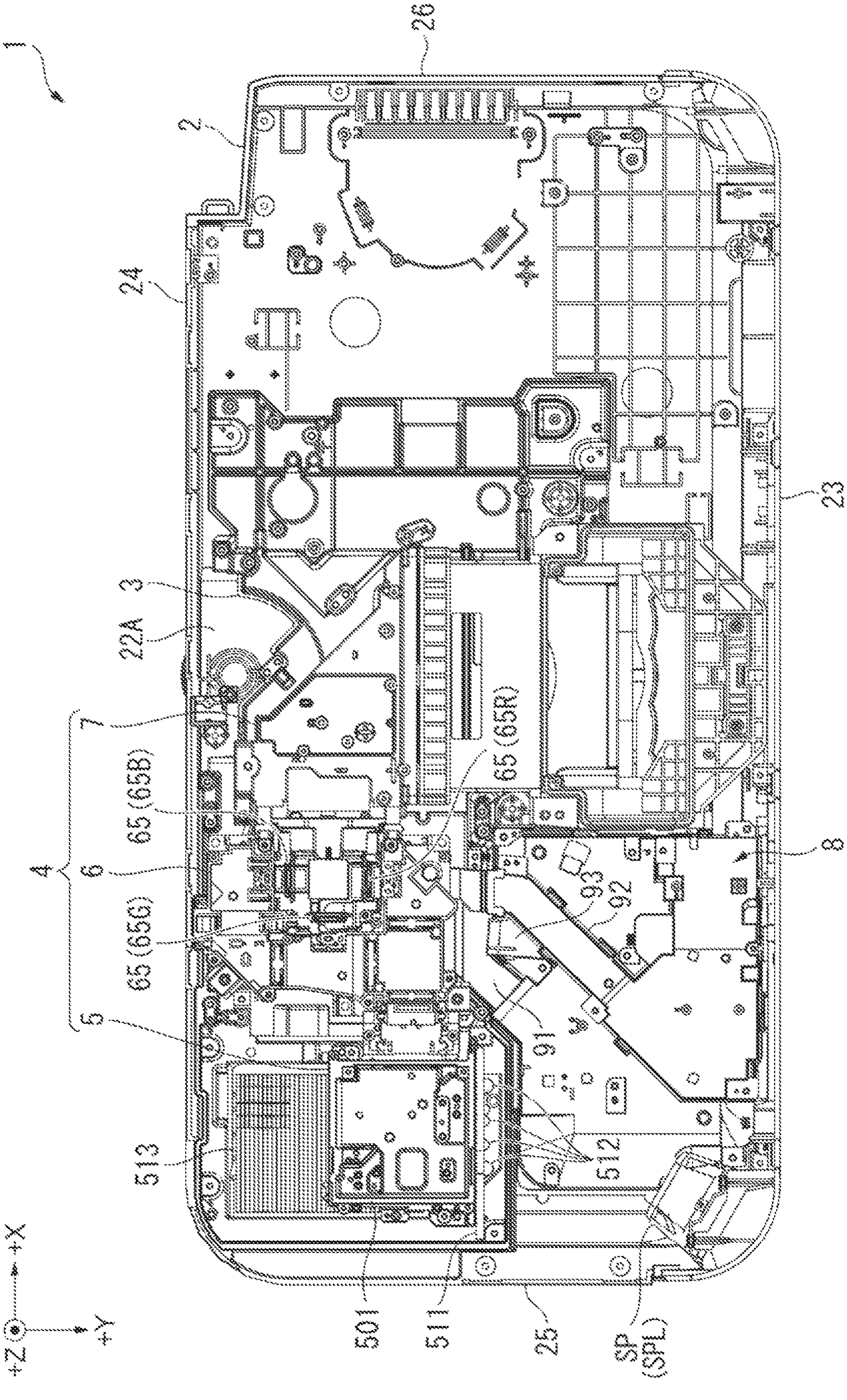
FIG. 6 is a plan view of the internal configuration of the projector according to the embodiment.

FIG. 6 is a plan view of the internal configuration of the projector 1 viewed in the direction +Z.

The projector 1 includes a base member 3, the image projection apparatus 4, and the cooling apparatus 8, which are housed in the exterior enclosure 2, as shown in FIG. 6. In addition to the components described above, the projector 1 includes, although not shown, the controller that controls the operation of the projector 1, and the power supply that supplies electronic parts of the projector 1 with electric power. The controller and the power supply are disposed at positions shifted from the projection optical apparatus 7, which constitutes the image projection apparatus 4, toward the right side surface 26. That is, the projector 1 includes the exterior enclosure 2, which houses the image projection apparatus 4 and the cooling apparatus 8, and the exterior enclosure 2 corresponds to the enclosure according to the present disclosure.

Configuration of Base Member

The base member 3 is disposed at an inner surface 22A of the bottom surface 22 and supports the image projection apparatus 4. The shape of the base member 3 viewed in the direction +Z matches the shape of the image projection apparatus 4 viewed in the direction +Z. That is, the base member 3 is formed in a substantially L-letter-like shape having a portion along the direction +X and a portion along the direction +Y.

Configuration of Image Projection Apparatus

Figure 7:
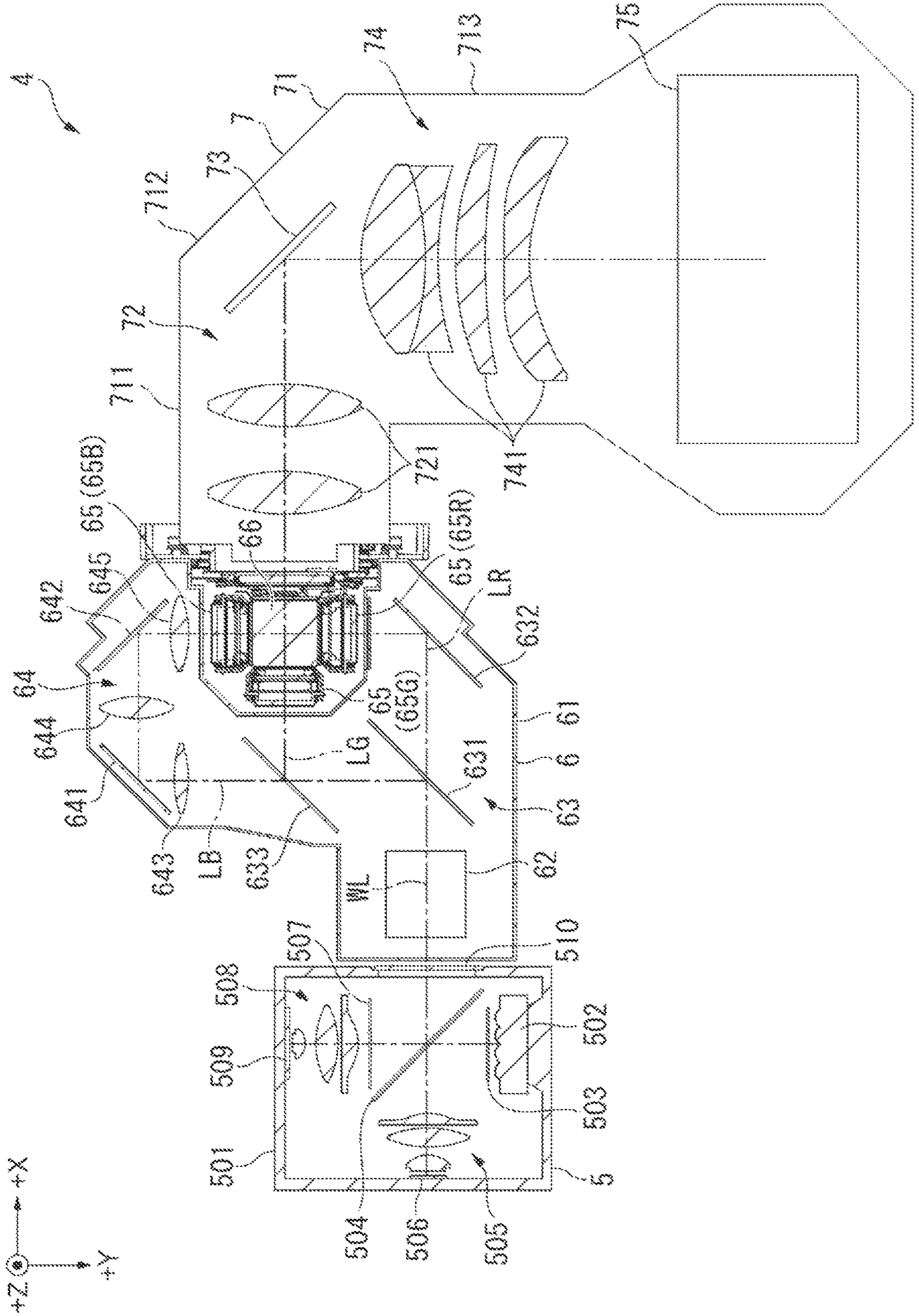
FIG. 7 is a diagrammatic view showing the configuration of an image projection apparatus in the embodiment.

FIG. 7 is a diagrammatic view showing the configuration of the image projection apparatus 4.

The image projection apparatus 4 generates an image according to an image signal inputted from the controller and projects the generated image. The image projection apparatus 4 includes a light source apparatus 5, an image formation apparatus 6, and the projection optical apparatus 7, as shown in FIGS. 6 and 7.

The image projection apparatus 4 is formed in a substantially L-letter-shape in which the image projection apparatus 4 extends from a position, in the exterior enclosure 2, that faces the rear surface 24 and the left side surface 25 toward the right side surface 26 and then bends at the center of the exterior enclosure 2 toward the front surface 23.

Configuration of Light Source Apparatus

The light source apparatus 5 is disposed at a position shifted in the direction −X from the projection optical apparatus 7 and outputs white light WL to the image formation apparatus 6. The white light WL is light containing blue light LB as first color light, red light LR as second color light, and green light LG as third color light.

The light source apparatus 5 includes a light source enclosure 501, a light source 502, a diffusive/transmissive element 503, a light combiner 504, a first light condenser 505, a wavelength converter 506, a first phase retarder 507, a second light condenser 508, an optical diffuser 509, and a second phase retarder 510, as shown in FIG. 7. The light source 502 is formed, for example, of a solid-state light emitter.

The light source enclosure 501 houses the light source 502, the diffusive/transmissive element 503, the light combiner 504, the first light condenser 505, the wavelength converter 506, the first phase retarder 507, the second light condenser 508, the optical diffuser 509, and the second phase retarder 510.

The light source apparatus 5 outputs the white light WL in the direction +X to the image formation apparatus 6 via the surface, of the light source enclosure 501, that faces the direction +X.

The light source apparatus 5 further includes a heat receiving plate 511, heat pipes 512, and a heat sink 513, as shown in FIG. 6.

The heat receiving plate 511 is provided at the end, of the light source enclosure 501, that faces the direction +Y. The heat receiving plate 511 receives heat from the light source 502.

The heat pipes 512 are coupled to the heat receiving plate 511 and the heat sink 513. The heat pipes 512 transport the heat generated by the light source 502 and transferred to the heat receiving plate 511 to the heat sink 513.

The heat sink 513 is disposed at a position shifted in the direction −Z from the light source enclosure 501. The heat of the light source 502 is transferred to the heat sink 513 via the heat pipes 512. The cooling gas delivered from the light source fan 90, which will be described later, flows to the heat sink 513. The heat sink 513 transfers the heat of the light source 502 to the cooling gas to cool the light source 502.

Configuration of Image Formation Apparatus

The image formation apparatus 6 generates the image light from the white light WL incident from the light source apparatus 5. In detail, the image formation apparatus 6 modulates the light incident from the light source apparatus 5 to generate the image light according to the image signal inputted from the controller.

The image formation apparatus 6 includes an image formation apparatus enclosure 61, a homogenizer 62, a color separation apparatus 63, a relay apparatus 64, a light modulator 65, and a color combiner 66.

Configurations of Image Formation Apparatus Enclosure and Homogenizer

The image formation apparatus enclosure 61 houses the homogenizer 62, the color separation apparatus 63, and the relay apparatus 64. In the image formation apparatus 6, an illumination optical axis that is an optical axis used at a design stage is set, and the image formation apparatus enclosure 61 holds the homogenizer 62, the color separation apparatus 63, and the relay apparatus 64 along the illumination optical axis. Further, the light modulator 65 and the color combiner 66 are disposed on the illumination optical axis.

The homogenizer 62 homogenizes the illuminance of the white light WL incident from the light source apparatus 5 and aligns the polarization states of the white light WL with one another. The white light WL having illuminance homogenized by the homogenizer 62 travels via the color separation apparatus 63 and the relay apparatus 64 and illuminates a modulation region of the light modulator 65. Although not shown in detail, the homogenizer 62 includes a pair of lens arrays that homogenize the illuminance, a polarization converter that aligns the polarization states with one another, and a superimposing lens that superimposes a plurality of sub-luminous fluxes into which the pair of lens arrays divide the white light WL with one another in the modulation region. The white light WL having passed through the homogenizer 62 is, for example, s-polarized linearly polarized light.

Configuration of Color Separation Apparatus

The color separation apparatus 63 separates the white light WL incident from the homogenizer 62 into the red light LR, the green light LG, and the blue light LB. The color separation apparatus 63 includes a first color separator 631, a first reflector 632, and a second color separator 633.

The first color separator 631 is disposed at a position shifted in the direction +X from the homogenizer 62. The first color separator 631 transmits in the direction +X the red light LR contained in the white light WL incident from the homogenizer 62 and reflects in the direction −Y the green light LG and the blue light LB contained in the white light WL to separate the red light LR from the green light LG and the blue light LB. The red light LR corresponds to the second color light.

The first reflector 632 reflects in the direction −Y the red light LR having passed through the first color separator 631 in the direction +X. The red light LR reflected off the first reflector 632 enters a red light modulator 65R.

The second color separator 633 is disposed at a position shifted in the direction −Y from the first color separator 631. The second color separator 633 reflects the green light LG in the direction +X out of the green light LG and the blue light LB reflected off the first color separator 631 and transmits the blue light LB in the direction −Y to separate the green light LG and the blue light LB from each other. The green light LG corresponds to the third color light, and the blue light LB corresponds to the first color light.

The green light LG separated by the second color separator 633 enters a green light modulator 65G. The blue light LB separated by the second color separator 633 enters the relay apparatus 64.

Configuration of Relay Apparatus

The relay apparatus 64 is provided in the optical path of the blue light LB, which is longer than the optical paths of the red light LR and the green light LG, and suppresses loss of the blue light LB. The relay apparatus 64 includes a second reflector 641, a third reflector 642, a light-incident-side lens 643, a relay lens 644, and a light-exiting-side lens 645.

The second reflector 641 reflects in the direction +X the blue light LB having passed through the second color separator 633 in the direction −Y. The third reflector 642 reflects in the direction +Y the blue light LB reflected off the second reflector 641. The light-incident-side lens 643 is disposed between the second color separator 633 and the second reflector 641. The relay lens 644 is disposed between the second reflector 641 and the third reflector 642. The light-exiting-side lens 645 is disposed between the third reflector 642 and the blue light modulator 65B.

In the present embodiment, the relay apparatus 64 is provided on the optical path of the blue light LB, but not necessarily. For example, the red light LR may be set as the color light having a longer optical path than the other color light, and the relay apparatus 64 may be provided on the optical path of the red light LR.

Configuration of Light Modulator

The light modulator 65 modulates the light incident thereon in accordance with the image signal. The light modulator 65 includes the red light modulator 65R, the blue light modulator 65B, and the green light modulator 65G.

The blue light modulator 65B corresponds to a first light modulator. The blue light modulator 65B modulates the blue light LB incident in the direction +Y via the light-exiting-side lens 645. That is, the blue light modulator 65B modulates the blue light LB, which is the first color light, out of the light outputted from the light source apparatus 5. The blue light LB modulated by the blue light modulator 65B travels in the direction +Y and enters the color combiner 66.

The red light modulator 65R corresponds to a second light modulator. The red light modulator 65R modulates the red light LR incident in the direction −Y via the first reflector 632. That is, the red light modulator 65R modulates the red light LR, which is the second color light, out of the light outputted from the light source apparatus 5. The red light LR modulated by the red light modulator 65R travels in the direction −Y and enters the color combiner 66.

The green light modulator 65G corresponds to a third light modulator. The green light modulator 65G modulates the green light LG incident in the direction +X from the second color separator 633. That is, the green light modulator 65G modulates the green light LG, which is the third color light, out of the light outputted from the light source apparatus 5. The green light LG modulated by the green light modulator 65G travels in the direction +X and enters the color combiner 66.

In the present embodiment, the light modulators 65B, 65R, and 65G each include a transmissive liquid crystal panel and a pair of polarizers that sandwich the transmissive liquid crystal panel.

Configuration of Color Combiner

The color combiner 66 combines the red light LR modulated by the red light modulator 65R, the green light LG modulated by the green light modulator 65G, and the blue light LB modulated by the blue light modulator 65B with one another to generate the image light. Specifically, the color combiner 66 reflects in the direction +X the red light LR incident in the direction −Y from the red light modulator 65R, transmits in the direction +X the green light LG incident in the direction +X from the green light modulator 65G, and reflects in the direction +X the blue light LB incident in the direction +Y from the blue light modulator 65B. The image light combined by the color combiner 66 exits in the direction +X along the light exiting optical axis of the color combiner 66, that is, the light exiting optical axis of the image formation apparatus 6 and enters the projection optical apparatus 7. That is, the extension of the optical axis of the green light LG reflected off the second color separator 633 coincides with the light exiting optical axis of the color combiner 66, and the light exiting optical axis of the color combiner 66 coincides with the light incident optical axis of the projection optical apparatus 7.

In the present embodiment, the color combiner 66 is formed of a cross dichroic prism, but not necessarily. The color combiner 66 can be formed, for example, of a plurality of dichroic mirrors.

Configuration of Projection Optical Apparatus

The projection optical apparatus 7 projects the image light generated by the image formation apparatus 6 onto the projection receiving surface described above. That is, the projection optical apparatus 7 projects the light modulated by the light modulator 65. The projection optical apparatus 7 includes a lens enclosure 71, an entrance optical path 72, an optical path changer 73, a passage optical path 74, and an enlarging reflection member 75.

The lens enclosure 71 is configured to have a substantially L-letter-like shape when the lens enclosure 71 is so viewed in the direction +Z that the direction +Y is oriented upward. That is, the lens enclosure 71 is formed in a substantially L-letter-like shape having a portion along the direction +X and a portion along the direction +Y. The lens enclosure 71 includes an entrance section 711, a deflection section 712, and an exit section 713.

The entrance section 711 is a portion that extends in the direction +X and constitutes the entrance optical path 72.

The deflection section 712 is a portion that couples the entrance section 711 to the exit section 713 and deflects in the direction +Y the direction in which the image light travels in the direction +X along the entrance optical path 72 in the entrance section 711. The optical path changer 73 is provided in the deflection section 712.

The exit section 713 is a portion that extends in the direction +Y from the deflection section 712, constitutes the passage optical path 74, and accommodates the enlarging reflection member 75. An opening via which the image light that travels in the direction converted by the enlarging reflection member 75 passes is provided in accordance with the enlarging reflection member 75 at a portion, of the exit section 713, that faces the direction +Z.

The entrance optical path 72 is an optical path which is provided in the entrance section 711 extending along the direction +X and along which the image light is incident in the direction +X from the image formation apparatus 6. That is, the light incident optical axis of the projection optical apparatus 7 is the optical axis of the entrance optical path 72 along the direction +X. The light incident optical axis of the projection optical apparatus 7 is parallel to the light exiting optical axis of the light source apparatus 5 and is shifted in the direction −Y from the light exiting optical axis of the light source apparatus 5.

A plurality of lenses 721 supported by the entrance section 711 are provided on the entrance optical path 72.

The optical path changer 73 deflects in the direction +Y the direction of the image light having traveled along the entrance optical path 72 in the direction +X. The optical path changer 73 is formed of a reflection mirror that reflects in the direction +Y the image light incident in the direction +X.

The passage optical path 74 is the optical path along which the image light travels in the direction changed by 90° by the optical path changer 73 and which is provided in the exit section 713 extending along the direction +Y. The image light travels along the passage optical path 74 in the direction +Y. A plurality of lenses 741 supported by the exit section 713 are present on the passage optical path 74.

The enlarging reflection member 75 is provided in the exit section 713 and disposed at a position shifted in the direction +Y, which the light exiting side of the passage optical path 74 faces. The enlarging reflection member 75 is an aspheric mirror that reverses the direction of the image light having traveled along the passage optical path 74. The image light reflected off the enlarging reflection member 75 passes through the opening of the lens enclosure 71 and diffuses while traveling in the direction +Z as the image light travels in the direction −Y, which is the opposite direction of the direction in which the image light travels along the passage optical path 74. That is, the enlarging reflection member 75 enlarges the image light incident thereon while reflecting the incident image light. The image light having passed through the opening of the lens enclosure 71 is projected out of the exterior enclosure 2 via the projection port 212 at the top surface 21. A large-screen image can thus be displayed on the projection receiving surface even when the distance between the projector 1 and the projection receiving surface is short. Note that the opposite direction described above includes an obliquely upward projection direction achieved by the aspheric mirror and a projection direction toward the rear surface 24 achieved by two reflection mirrors deflecting the optical path.

Configuration of Cooling Apparatus

Figure 8:
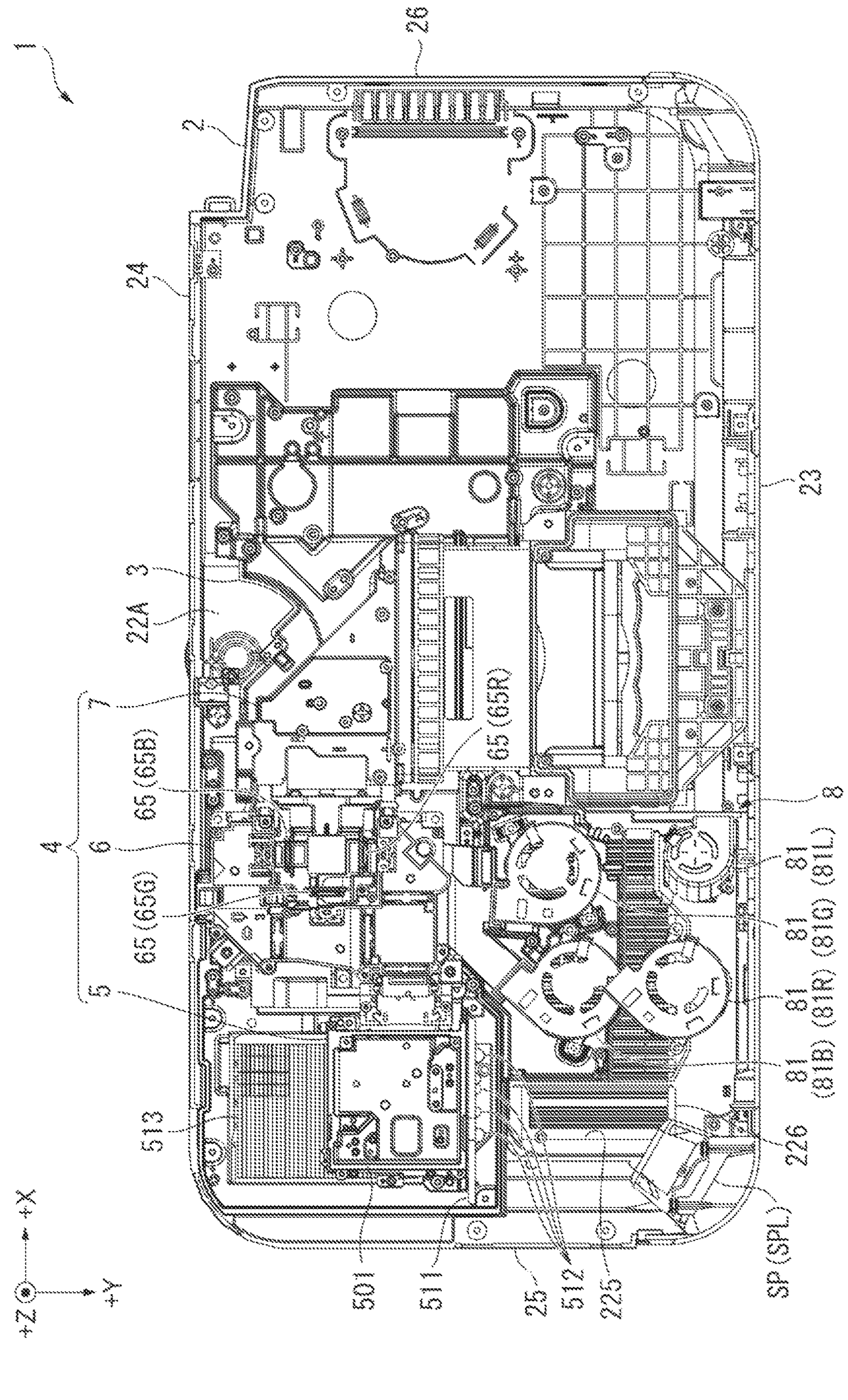
FIG. 8 is a plan view showing the arrangement of centrifugal fans in the embodiment.

FIG. 8 is a plan view showing an arrangement of the centrifugal fans 81B, 81G, 81R, and 81L provided in the cooling apparatus 8 in the exterior enclosure 2.

The cooling apparatus 8 cools the cooling targets in the projector 1. The cooling apparatus 8 is disposed at a position surrounded by the image projection apparatus 4, which has a substantially L-letter-like shape in the exterior enclosure 2, as shown in FIGS. 6 and 8. The cooling apparatus 8 includes a plurality of centrifugal fans 81, as shown in FIG. 8. In the present embodiment, the plurality of centrifugal fans 81 include a first centrifugal fan 81B, a second centrifugal fan 81R, a third centrifugal fan 81G, and a fourth centrifugal fan 81L.

The first centrifugal fan 81B, the second centrifugal fan 81R, the third centrifugal fan 81G, and the fourth centrifugal fan 81L are provided in a region defined by the image formation apparatus 6 and the exit section 713, through which the image light having an optical path changed so as to extend in the direction +Y passes in the projection optical apparatus 7. In other words, the centrifugal fans 81B, 81R, 81G, and 81L are provided at positions shifted in the direction +X from the left loudspeaker SPL provided at an end portion facing the directions −X and +Y in the exterior enclosure 2. That is, the centrifugal fans 81B, 81R, 81G, and 81L are provided at positions shifted in the direction +X from the left loudspeaker SPL provided at the side across the region defined by the image formation apparatus 6 and the projection optical apparatus 7 from the projection optical apparatus 7 when viewed in the direction +Z. In detail, the centrifugal fans 81B, 81R, 81G, and 81L are disposed at positions where the centrifugal fans are unlikely to be affected by the magnetic field generated by the left loudspeaker SPL.

Configuration of First Centrifugal Fan

Figure 9:
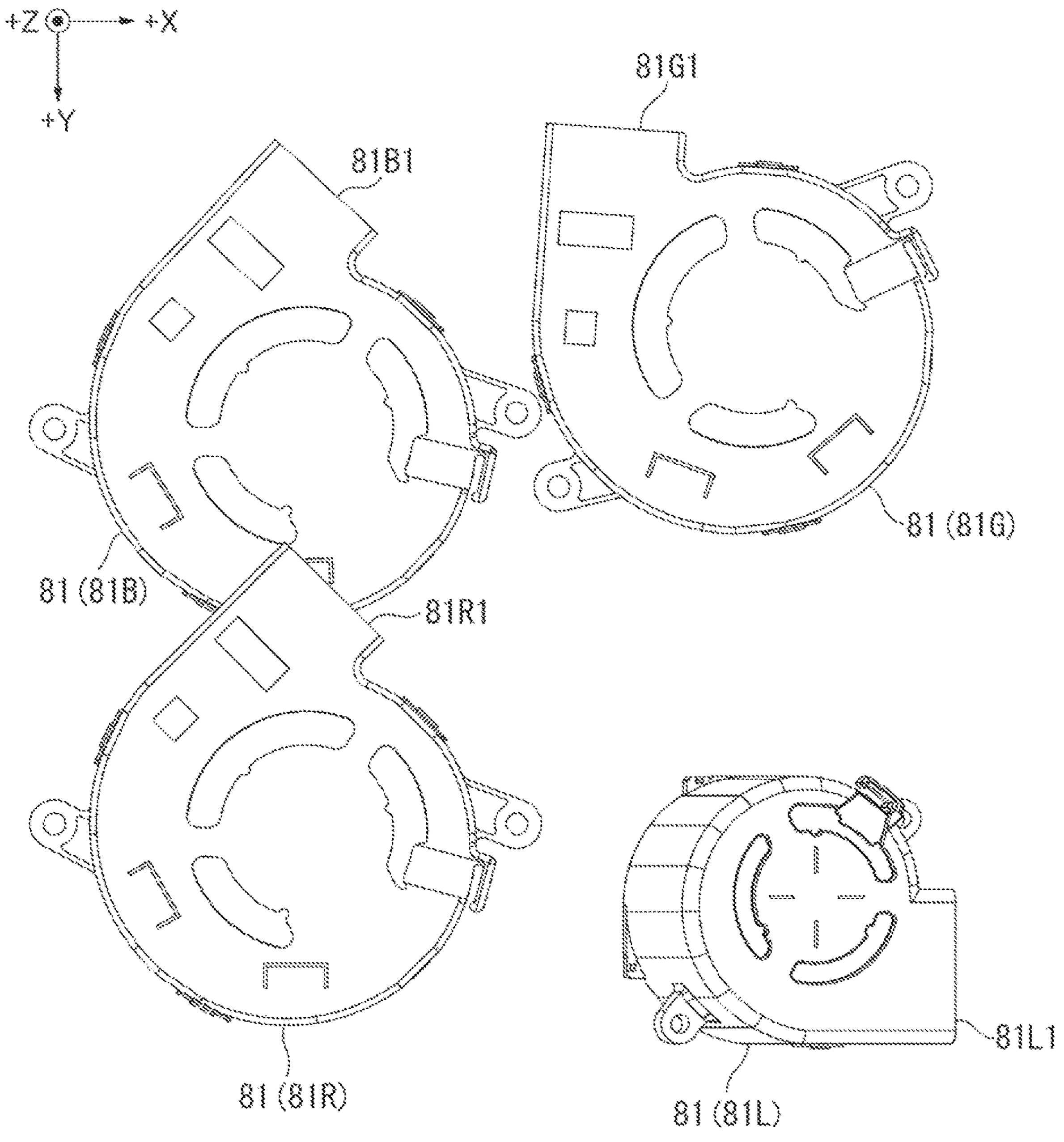
FIG. 9 is a plan view showing the arrangement of the centrifugal fans in the embodiment.
Figure 10:
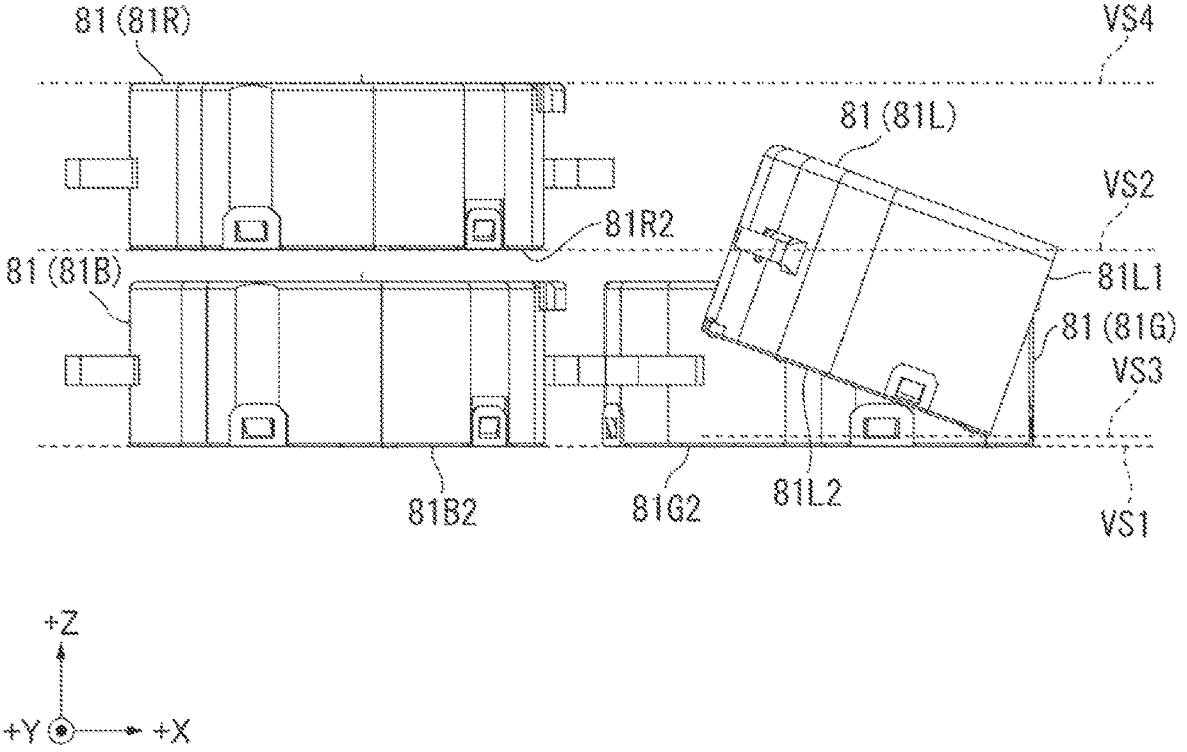
FIG. 10 is a side view showing the arrangement of the centrifugal fans in the embodiment.

FIG. 9 is a plan view showing the arrangement of the centrifugal fans 81B, 81R, 81G, and 81L viewed in the direction +Z, and FIG. 10 is a side view showing the arrangement of the centrifugal fans 81B, 81R, 81G, and 81L viewed in the direction +Y.

The first centrifugal fan 81B is a centrifugal fan 81 provided in accordance with the blue light modulator 65B, which is the first light modulator, and is linked to a first duct 91, which will be described later. The first centrifugal fan 81B delivers the cooling gas that cools the blue light modulator 65B into the first duct 91, which will be described later. The first centrifugal fan 81B is disposed at a position shifted from the second centrifugal fan 81R in the direction −Y, which is the opposite direction of the second direction, as shown in FIGS. 8 and 9. Furthermore, the first centrifugal fan 81B is disposed at a position shifted from the second centrifugal fan 81R in the direction −Z, which is the opposite direction of the third direction, as shown in FIGS. 8 to 10. That is, a portion of the first centrifugal fan 81B overlaps with a portion of the second centrifugal fan 81R when viewed in the direction +Z.

An outlet 81B1 of the first centrifugal fan 81B is provided at a position facing the directions +X and −Y, and the first centrifugal fan 81B delivers the cooling gas in the directions +X and −Y, as shown in FIG. 9.

An intake surface 81B2, on the first centrifugal fan 81B, which is provided with an intake port 81B3 (see FIGS. 15 and 16) is substantially parallel to an imaginary plane VS1, which is a plane XY specified by the direction +X, which is the first direction, and the direction +Y, which is the second direction, as shown in FIG. 10. That is, the angle between the intake surface 81B2 of the first centrifugal fan 81B and the imaginary plane VS1 is about 0°.

When the projector 1 is so installed that the directions +Z and −Z are parallel to the vertical direction, the plane XY is a plane perpendicular to the vertical direction.

Configuration of Second Centrifugal Fan

The second centrifugal fan 81R is a centrifugal fan 81 provided in accordance with the red light modulator 65R, which is the second light modulator, and is linked to a second duct 92, which will be described later. The second centrifugal fan 81R delivers the cooling gas that cools the red light modulator 65R into the first duct 92, which will be described later. The second centrifugal fan 81R is disposed at a position shifted from the first centrifugal fan 81B in the direction +Y, which is the second direction, as shown in FIGS. 8 and 9. That is, the second centrifugal fan 81R is disposed at the side across the first centrifugal fan 81B from the image formation apparatus 6. Furthermore, the second centrifugal fan 81R is disposed at a position shifted from the first centrifugal fan 81B in the direction +Z, which is the third direction, as shown in FIGS. 8 to 10.

An outlet 81R1 of the second centrifugal fan 81R is provided at a position facing the directions +X and −Y, and the second centrifugal fan 81R delivers the cooling gas in the directions +X and −Y, as shown in FIG. 9. The direction in which the second centrifugal fan 81R delivers the cooling gas is substantially parallel to the direction in which the first centrifugal fan 81B delivers the cooling gas.

Figure 15:
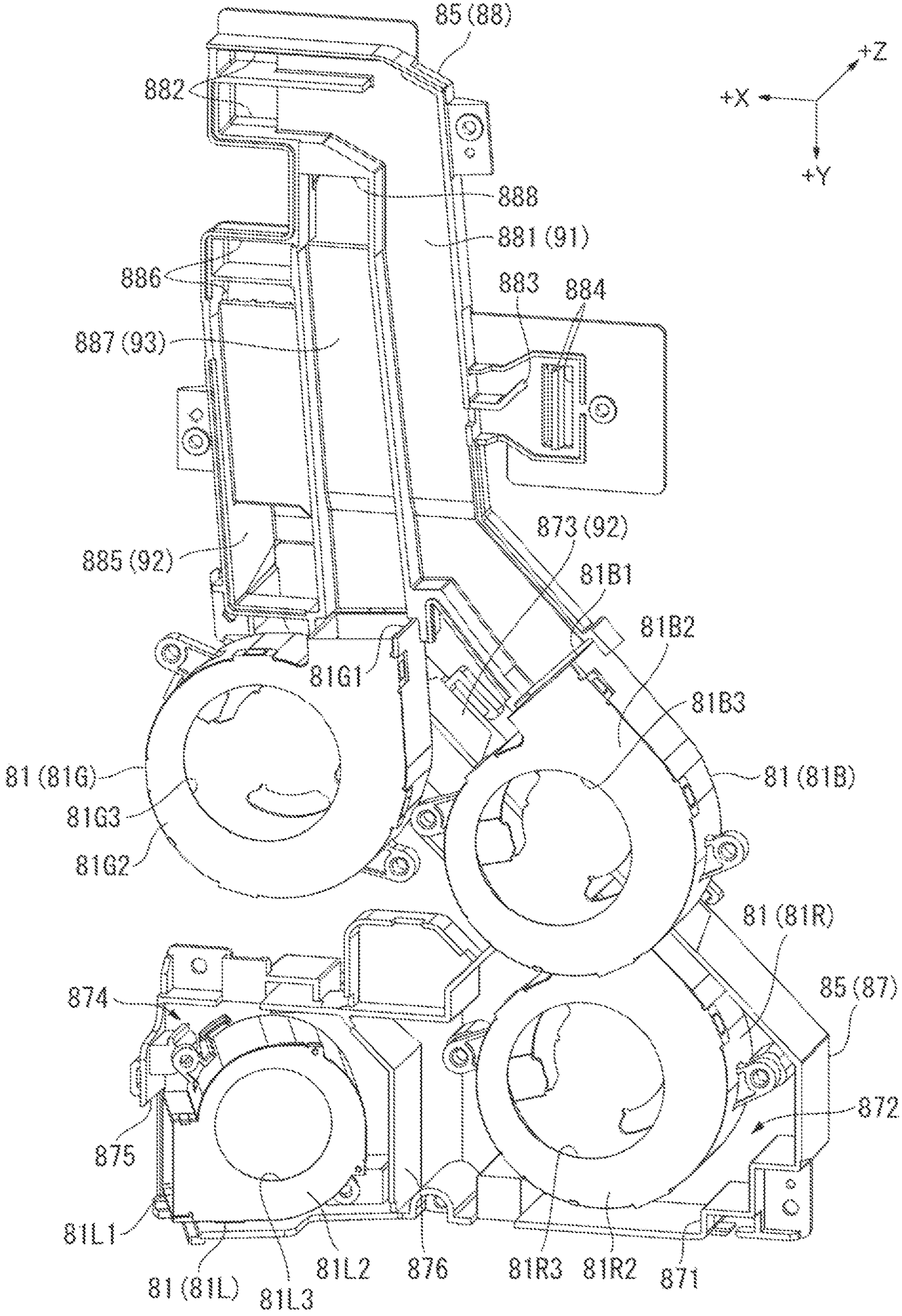
FIG. 15 is a perspective view showing the centrifugal fans, a delivery-side member, and an upper member in the embodiment.
Figure 16:
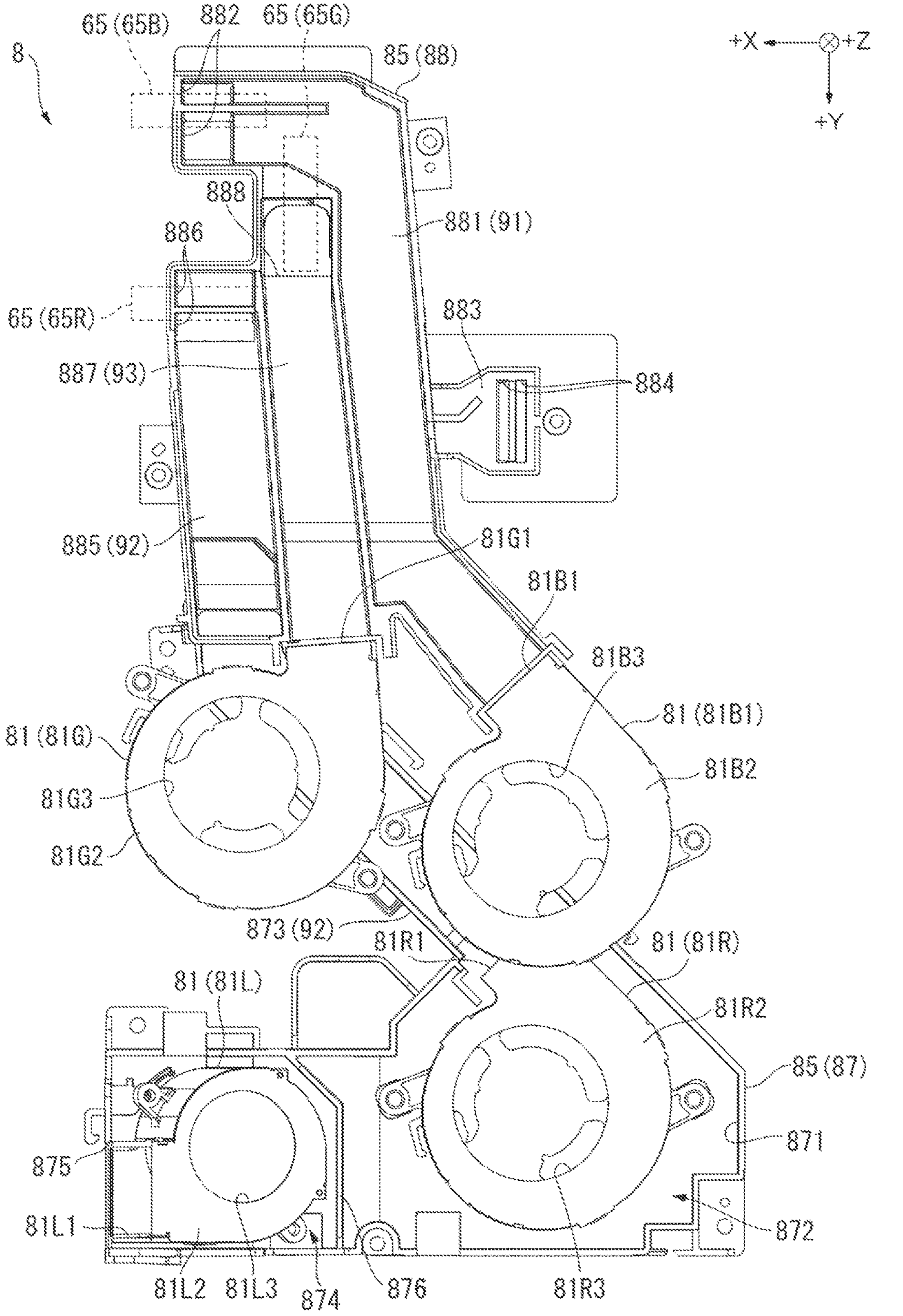
FIG. 16 shows the centrifugal fans, the delivery-side member, and the upper member in the embodiment.

An intake surface 81R2, of the second centrifugal fan 81R, which is provided with an intake port 81R3 shown in FIGS. 15 and 16, is substantially parallel to an imaginary plane VS2, which is the plane XY, as shown in FIG. 10. That is, the angle between the intake surface 81R2 of the second centrifugal fan 81R and the imaginary plane VS2 is about 0°.

Let the position of a first stage be the position where the first centrifugal fan 81B is disposed in the direction +Z, the second centrifugal fan 81R is disposed at a second stage next to the first stage in the direction +Z.

A portion of the second centrifugal fan 81R overlaps with a portion of the first centrifugal fan 81B when viewed in the direction +Z, as shown in FIGS. 8 and 9. In detail, the outlet 81R1 of the second centrifugal fan 81R overlaps with a portion of the first centrifugal fan 81B when viewed in the direction +Z.

Configuration of Third Centrifugal Fan

The third centrifugal fan 81G is a centrifugal fan 81 provided in accordance with the green light modulator 65G, which is the third light modulator, and is linked to a third duct 93, which will be described later. The third centrifugal fan 81G delivers the cooling gas that cools the green light modulator 65G into the third duct 93, which will be described later. The third centrifugal fan 81G is disposed at a position shifted from the first centrifugal fan 81B in the direction +X, which is the first direction, as shown in FIGS. 8 and 9. In detail, the third centrifugal fan 81G is flush with the first centrifugal fan 81B in the direction +Z, but is shifted in the direction +X from the first centrifugal fan 81B, as shown in FIGS. 8 to 10. That is, the third centrifugal fan 81G is disposed at the first stage described above.

An outlet 81G1 of the third centrifugal fan 81G is provided at a position facing the direction −Y, and the third centrifugal fan 81G delivers the cooling gas in the direction −Y, as shown in FIG. 9.

An intake surface 81G2, of the third centrifugal fan 81G, which is provided with an intake port 81G3 shown in FIGS. 15 and 16, is substantially parallel to the imaginary plane VS1, as shown in FIG. 10. That is, the angle between the intake surface 81G2 of the third centrifugal fan 81G and the imaginary plane VS1 is about 0°. A plane extended from the intake surface 81G2 and a plane extended from the intake surface 81B2 of the first centrifugal fan 81B coincides with each other.

The first centrifugal fan 81B, the second centrifugal fan 81R, and the third centrifugal fan 81G are centrifugal fans having the same specifications. The centrifugal fans 81B, 81R, and 81G therefore have the same dimensions, and when they rotate at the same rotational speed per unit time, the centrifugal fans 81B, 81R, and 81G deliver the same amount of cooling gas.

Configuration of Fourth Centrifugal Fan

The fourth centrifugal fan 81L delivers the cooling gas to the end, of the projection optical apparatus 7, that faces the direction +Y to cool the enlarging reflection member 75 provided at the end facing the direction +Y. The fourth centrifugal fan 81L is disposed at a position shifted from the second centrifugal fan 81R in the direction +X, which is the first direction, and shifted from the third centrifugal fan 81G in the direction +Y, which is the second direction, as shown in FIGS. 8 to 10.

An outlet 81L1 of the fourth centrifugal fan 81L is provided at a position facing the directions +X and −Z, and the fourth centrifugal fan 81L delivers the cooling gas in the directions +X and −Z, as shown in FIG. 10.

An intake surface 81L2, of the fourth centrifugal fan 81L, which is provided with an intake port 81L3 shown in FIGS. 15 and 16, intersects with an imaginary plane VS3, which is the plane XY, at about 19°. That is, the angle between the intake surface 81L2 of the fourth centrifugal fan 81L and the imaginary plane VS3 is about 19°, and the intake surface 81L2 of the fourth centrifugal fan 81L inclines by the angle of about 19° with respect to the imaginary plane VS3.

The dimensions of the fourth centrifugal fan 81L are smaller than those of the centrifugal fan having the largest dimensions out of the centrifugal fans 81B, 81R, and 81G, as shown in FIGS. 8 to 10. In the present embodiment, in which the centrifugal fans 81B, 81R, and 81G have the same dimensions, the dimensions of the fourth centrifugal fan 81L are smaller than those of the centrifugal fans 81B, 81R, and 81G. That is, the fourth centrifugal fan 81L is smaller than the other centrifugal fans 81B, 81R, and 81G. The suction force produced by the fourth centrifugal fan 81L to suck the cooling gas and the amount of cooling gas delivered by the fourth centrifugal fan 81L are therefore smaller than those achieved by the other centrifugal fans 81B, 81R, and 81G.

The end, of the fourth centrifugal fan 81L, that faces the direction −Z is shifted in the direction +Z from one of the end, of the first centrifugal fan 81B, that faces the direction −Z and the end, of the third centrifugal fan 81G, that faces the direction −Z, the one end shifted by a greater amount in the direction −Z, as shown in FIG. 10. Furthermore, the end, of the fourth centrifugal fan 81L, that faces the direction +Z is shifted in the direction −Z from the end, of the second centrifugal fan 81R, that faces the direction +Z. That is, the fourth centrifugal fan 81L is disposed between the imaginary plane VS1, which is the plane XY passing through the ends, of the centrifugal fans 81B and 81G, that face the direction −Z and an imaginary plane VS4, which is the plane XY passing through the end, of the second centrifugal fan 81R, that faces the direction +Z.

In the present embodiment, the fourth centrifugal fan 81L is disposed at a position where a portion of the fourth centrifugal fan 81L does not overlap with a portion of any of the centrifugal fans 81B, 81R, and 81G when viewed in the direction +Z, as shown in FIGS. 8 and 9, but not necessarily. The fourth centrifugal fan 81L may instead be so disposed that a portion of the fourth centrifugal fan 81L overlaps with a portion of at least one of the first centrifugal fan 81B, the second centrifugal fan 81R, and the third centrifugal fan 81G.

The end, of the fourth centrifugal fan 81L, that faces the direction +Y is shifted in the direction +Y from the end, of the second centrifugal fan 81R, that faces the direction +Y, but not necessarily. The fourth centrifugal fan 81L may instead be so disposed that the end, of the fourth centrifugal fan 81L, that faces the direction +Y is shifted in the direction −Y from the end, of the second centrifugal fan 81R, that face the direction +Y.

Configuration of Duct Members

Figure 11:
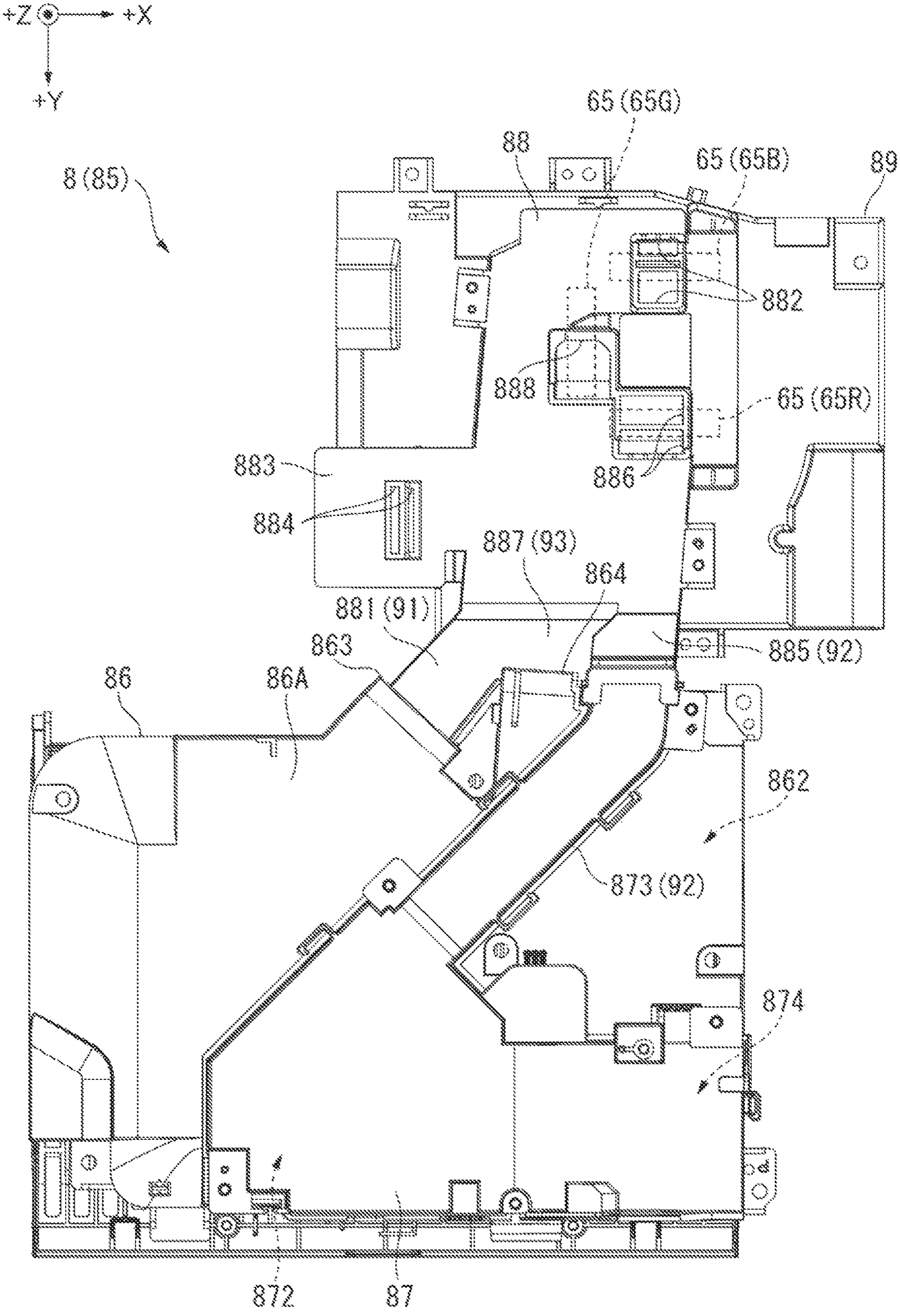
FIG. 11 is a plan view showing a duct member in the embodiment.
Figure 12:
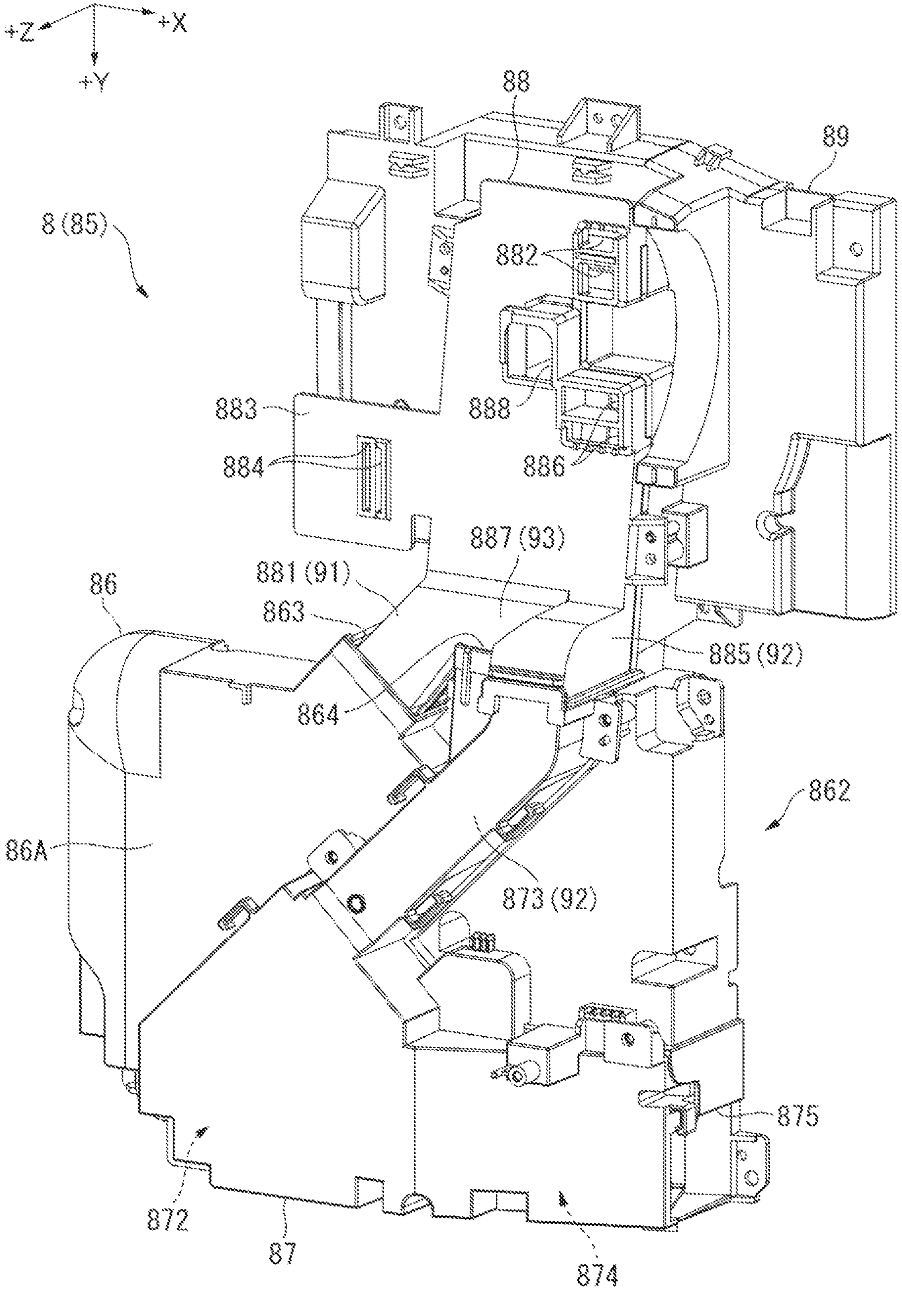
FIG. 12 is a perspective view showing the duct member in the embodiment.

FIG. 11 is a plan view showing a duct member 85, which constitutes the cooling apparatus 8, and FIG. 12 is a perspective view showing the duct member 85.

The cooling apparatus 8 includes the duct member 85 shown in FIGS. 6, 11, and 12 in addition to the centrifugal fans 81B, 81R, 81G, and 81L described above.

The duct member 85 houses the centrifugal fans 81B, 81R, 81G, and 81L. The duct member 85 guides the cooling gas delivered from the centrifugal fans 81B, 81R, and 81G to the corresponding light modulators 65R, 65B, and 65G. The duct member 85 is formed of the combination of an intake-side member 86, a delivery-side member 87, an upper member 88, and a lower member 89, as shown in FIGS. 11 and 12.

Configuration of Intake-Side Member

Figure 13:
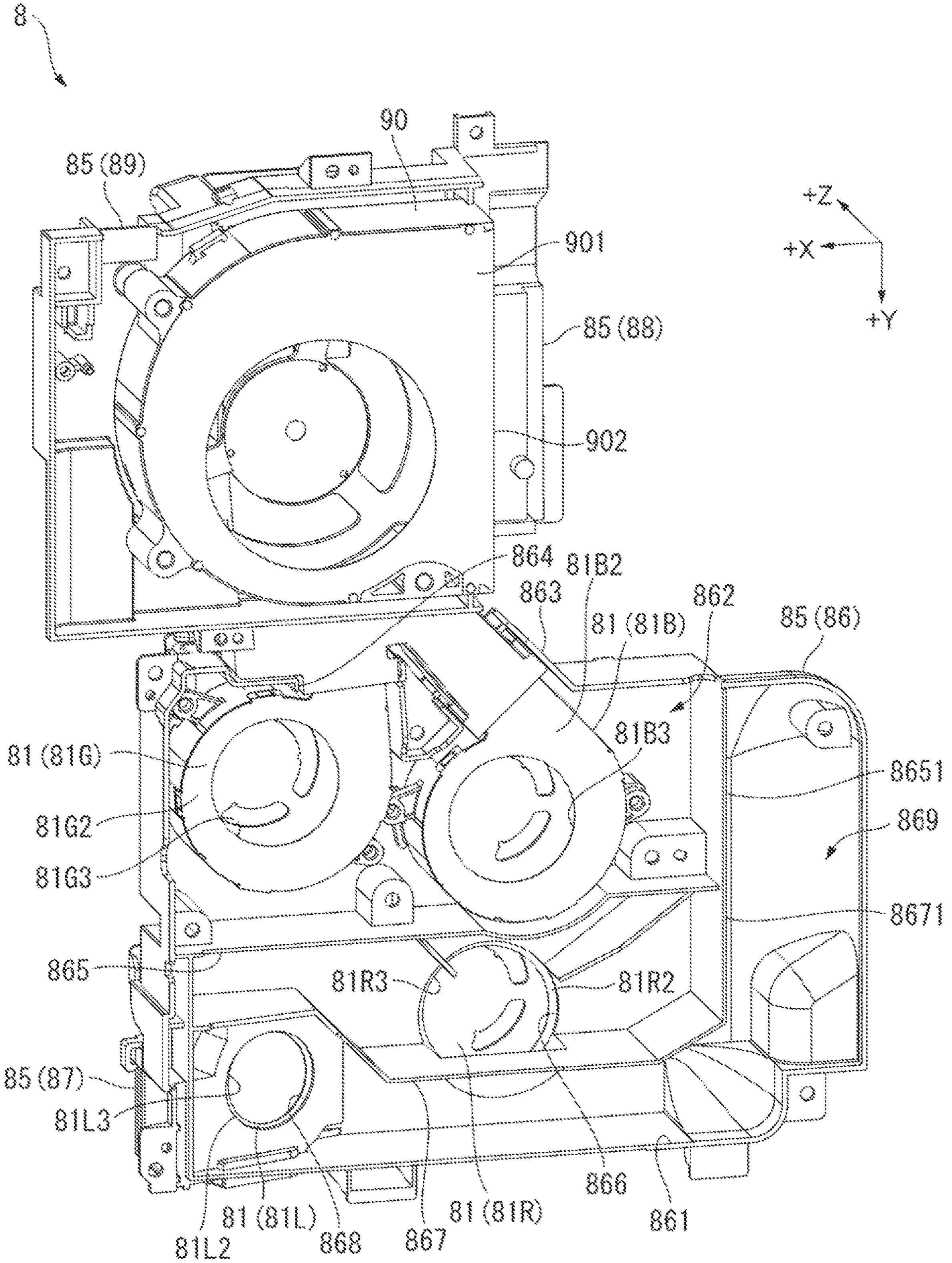
FIG. 13 is a perspective view showing an intake-side member in the embodiment.
Figure 14:
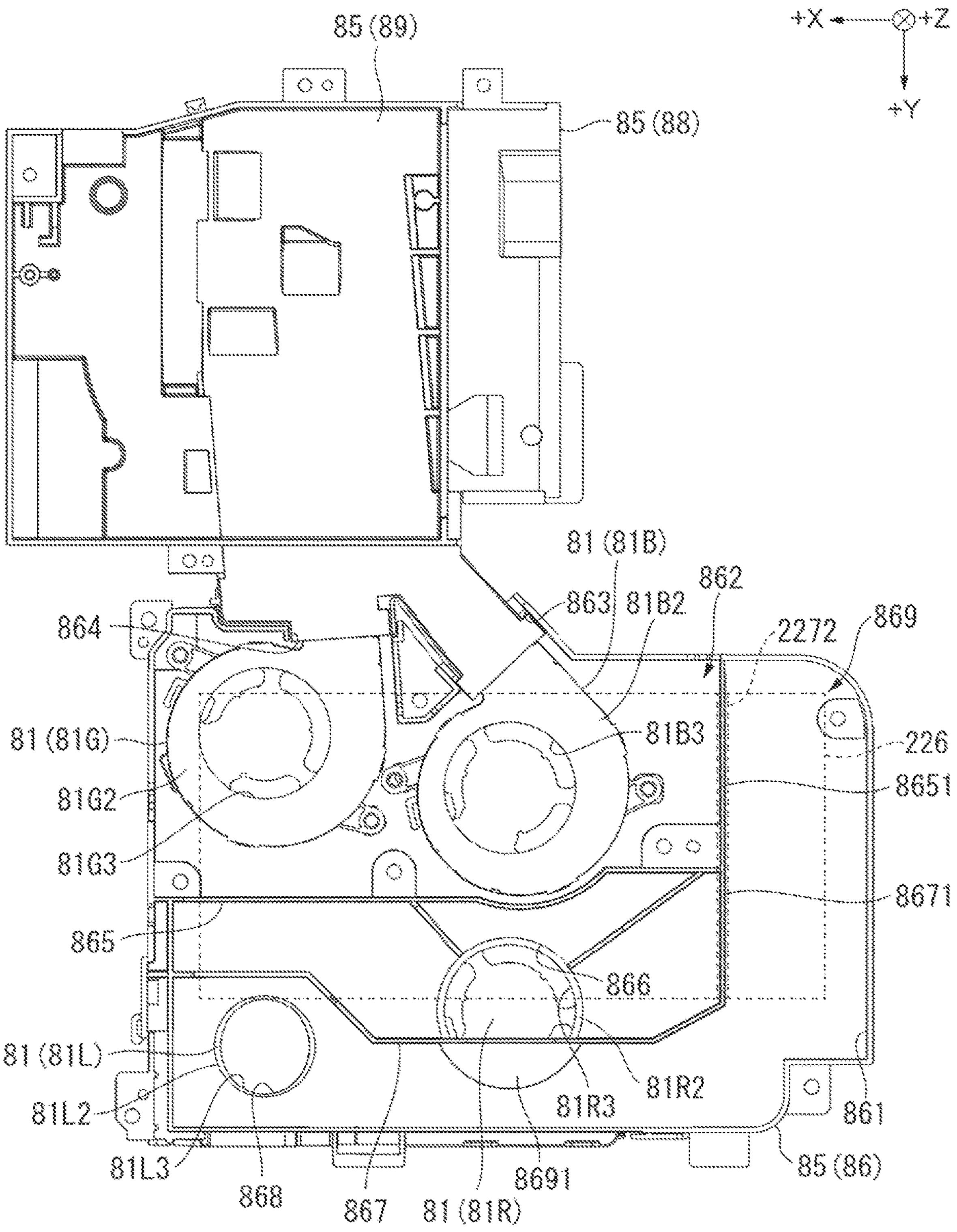
FIG. 14 shows the intake-side member in the embodiment.

FIG. 13 is a perspective view showing the intake-side member 86 viewed in the direction −Z, and FIG. 14 shows the intake-side member 86 viewed in the direction −Z. The dotted line in FIG. 14 indicates the position of the air filter 226 provided at the introduction port 225.

The intake-side member 86 houses the first centrifugal fan 81B and the third centrifugal fan 81G, and guides the cooling gas introduced into the exterior enclosure 2 via the introduction port 225 shown in FIG. 5 to the centrifugal fans 81B, 81R, 81G, and 81L. The intake-side member 86 includes a recess 861, a fan placement section 862, a first coupler 863, a second coupler 864, a first parting section 865, an opening 866, a second parting section 867, an opening 868, and an intake duct 869.

The recess 861 is a portion recessed in the direction +Z from a circumferential edge portion of the intake-side member 86 when viewed in the direction −Z. The circumferential edge portion of the intake-side member 86 is in contact with the inner surface 22A of the bottom surface 22.

The fan placement section 862 is a portion where the first centrifugal fan 81B and the third centrifugal fan 81G are disposed. The first centrifugal fan 81B is so disposed that the intake surface 81B2 faces the direction −Y, and the third centrifugal fan 81G is so disposed that the intake surface 81G2 faces the direction −Y.

The first coupler 863 and the second coupler 864 are provided at positions, in the fan placement section 862, that face the direction −Y. The upper member 88 and the lower member 89 coupled to the outlet 81B1 of the first centrifugal fan 81B are coupled to the first coupler 863. The upper member 88 and the lower member 89 coupled to the outlet 81G1 of the third centrifugal fan 81G are coupled to the second coupler 864.

The first parting section 865 is formed in the shape of a frame that surrounds the fan placement section 862 and parts the interior of the fan placement section 862 from the exterior thereof. The first parting section 865 is raised in the direction −Z from the bottom surface of the recess 861. Therefore, out of the air having passed through the air filter 226, the air having passed in the direction +Z through the region according to the first parting section 865 is sucked as the cooling gas by the first centrifugal fan 81B and the third centrifugal fan 81G.

The opening 866 passes through the intake-side member 86 in the direction +Z. The opening 866 is provided at a position, on the bottom surface of the recess 861, that is shifted in the direction +Y from the first parting section 865. In detail, the opening 866 is provided in correspondence with the intake port 81R3 of the second centrifugal fan 81R. The opening 866 causes the space inside the intake-side member 86 to communicate with the space, outside the intake-side member 86, where the second centrifugal fan 81R is disposed. The intake surface 81R2 of the second centrifugal fan 81R is exposed to the interior of the intake-side member 86 via the opening 866.

The second parting section 867 is formed in the shape of a frame that surrounds the opening 866. The second parting section 867 is raised in the direction −Y from the bottom surface of the recess 861. Therefore, out of the air having passed through the air filter 226, the air having passed in the direction +Z through the region according to the second parting section 867 is sucked as the cooling gas by the second centrifugal fan 81R.

The area of the surface surrounded by the second parting section 867 is about ⅔ the area of the surface surrounded by the first parting section 865. The amount of sucked cooling gas sucked by the first centrifugal fan 81B, which is disposed in the first parting section 865, the amount of sucked cooling gas sucked by the second centrifugal fan 81R via the opening 866 in the second parting section 867, and the amount of sucked cooling gas sucked by the third centrifugal fan 81G, which is disposed in the first parting section 865, are substantially the same.

Note that an end 8651, of the first parting section 865, that faces the direction −X and an end 8671, of the second parting section 867, that faces the direction −X extend in the directions ±Y and are coupled to each other. The ends 8651 and 8671 overlap with the parting section 2272 of the air filter 226 when viewed in the direction −Z. That is, the air sucked by the centrifugal fans 81B, 81R, and 81G is the air having passed in the direction +Z through the region, of the air filter 226, that is shifted in the direction +X from the parting section 2272.

The opening 868 passes through the intake-side member 86 in the direction +Z. The opening 868 is provided at a corner portion, of the bottom surface of the recessed section 861, that faces the directions +X and +Y. In detail, the opening 868 is provided in correspondence with the intake port 81L3 of the fourth centrifugal fan 81L. The opening 868 causes the space inside the intake-side member 86 to communicate with the space, inside the deliver-side member 87, where the fourth centrifugal fan 81L is disposed. The intake surface 81L2 of the fourth centrifugal fan 81L is exposed to the interior of the intake-side member 86 via the opening 868.

The intake duct 869 guides the cooling gas introduced into the recess 861 to the opening 868. That is, the intake duct 869 is a duct that couples the air filter 226 to the fourth centrifugal fan 81L independently of the centrifugal fans 81B, 81R, and 81G. The intake duct 869 is provided in the recess 861 and is formed of a region shifted in the direction −X from the first parting section 865 and the second parting section 867, and a region shifted in the direction +Y from the second parting section 867. That is, the intake duct 869 is the space inside the recess 861 and outside the first parting section 865 and the second parting section 867.

The air having passed in the direction +Z through the region, of the air filter 226, that is shifted in the direction −X from the parting section 2272 is introduced into the intake duct 869. Therefore, when the fourth centrifugal fan 81L is driven, the cooling gas having passed through the region shifted in the direction −Z from the parting section 2272 flows in the direction +Y through the intake duct 869 and then flows in the direction +X. The cooling gas having flowed in the direction +X through the intake duct 869 is sucked by the fourth centrifugal fan 81L via the opening 868, and is delivered from the fourth centrifugal fan 81L toward the projection optical apparatus 7.

A portion of the intake duct 869 overlaps with the intake port 81R3 of the second centrifugal fan 81R when viewed in the direction −Z. The intake duct 869 therefore includes a covering section 8691, which covers a portion of the intake port 81R3 in the direction −Z.

Configuration of Delivery-Side Member

FIGS. 15 and 16 show the cooling apparatus 8 with the intake-side member 86 and the lower member 89 omitted. Specifically, FIG. 15 is a perspective view of the centrifugal fans 81B, 81R, 81G, and 81L, the delivery-side member 87, and the upper member 88 viewed in the direction −Z. FIG. 16 shows the centrifugal fans 81B, 81R, 81G, and 81L, the delivery-side member 87, and the upper member 88 viewed in the direction −Z. In FIGS. 15 and 16, the intake-side member 86 and the lower member 89 are omitted.

The delivery-side member 87 in combination with the intake-side member 86 houses the second centrifugal fan 81R and the fourth centrifugal fan 81L. The delivery-side member 87 includes a recess 871, a placement section 872, a second duct forming section 873, a placement section 874, an opening 875, and a parting section 876.

The recess 871 is a portion, of the delivery-side member 87, that is recessed in the direction +Z. The circumferential edge portion of the recess 871 is coupled to a surface 86A, of the intake-side member 86 shown in FIGS. 11 and 12, that faces the direction +Z.

The placement section 872 is provided at a position, in the recess 871, that is shifted in the directions −X and +Y. The second centrifugal fan 81R is so disposed in the placement section 872 that the intake surface 81R2 faces the direction −Z. As described above, the second centrifugal fan 81R sucks the air introduced into the second parting section 867 via the opening 866 out of the air having passed through the air filter 226 in the direction +Z.

The second duct forming section 873 forms a portion, of the second duct 92, through which the cooling gas delivered from the second centrifugal fan 81R flows when the delivery-side member 87 is combined with the intake-side member 86. The second duct forming section 873 is coupled to a second duct forming section 885 of the upper member 88.

A portion of the second duct forming section 873 overlaps with a portion of the first centrifugal fan 81B when viewed in the directions ±Z, and another portion of the second duct forming section 873 overlaps with a portion of the third centrifugal fan 81G when viewed in the directions ±Z, as shown in FIG. 16. That is, a portion, of the second duct 92, that is partially formed by the second duct forming section 873 overlaps with a portion of the first centrifugal fan 81B when viewed in the directions ±Z, and another portion of the second duct 92 overlaps with a portion of the third centrifugal fan 81G when viewed in the directions ±Z.

The placement section 874 is provided at a position, in the recess 871, that is shifted in the directions +X and +Y, as shown in FIGS. 15 and 16. The fourth centrifugal fan 81L is so disposed in the placement section 874 that the intake surface 81L2 faces the direction −Z. As described above, the fourth centrifugal fan 81L sucks the air introduced into the intake duct 869 via the opening 868 out of the air having passed through the air filter 226 in the direction +Z.

The opening 875 is formed as a cutout of a portion, of a circumferential edge portion of the recess 871, that faces the directions +Z and +Y. When the delivery-side member 87 is combined with the intake-side member 86, the opening 875 causes the space in the placement section 874 to communicate with the space outside the delivery-side member 87. The cooling gas delivered from the fourth centrifugal fan 81L is delivered via the opening 875 in the directions +X and −Z, and flows to the end, of the projection optical apparatus 7, that faces the direction +Y.

The parting section 876 is raised in the direction −Z from the bottom surface of the recess 871 and is in contact with the surface 86A of the intake-side member 86. The space in the placement section 872 and the space in the placement section 874 are thus parted from each other. The parting section 876 can separate the cooling gas introduced into the placement section 872 via the opening 866 from the cooling gas introduced into the placement section 874 via the opening 868.

Configuration of Upper Member

The upper member 88, when combined with the lower member 89 shown in FIGS. 11 and 12 and disposed at a position shifted in the direction −Z from the upper member 88, the intake-side member 86, and the delivery-side member 87, forms the first duct 91, the second duct 92, and the third duct 93. That is, the cooling apparatus 8 includes the first duct 91, the second duct 92, and the third duct 93.

The first duct 91 is a duct provided in accordance with the blue light modulator 65B as the first light modulator. The first duct 91 guides the cooling gas delivered from the first centrifugal fan 81B to the blue light modulator 65B.

The second duct 92 is a duct provided in accordance with the red light modulator 65R as the second light modulator. The second duct 92 guides the cooling gas delivered from the second centrifugal fan 81R to the red light modulator 65R.

The third duct 93 is a duct provided in accordance with the green light modulator 65G as the third light modulator. The third duct 93 guides the cooling gas delivered from the third centrifugal fan 81G to the green light modulator 65G.

The upper member 88 has a first duct forming section 881, a first outlet 882, a branch section 883, a branch outlet 884, the second duct forming section 885, a second outlet 886, a third duct forming section 887, and a third outlet 888, as shown in FIGS. 15 and 16.

The first duct forming section 881 forms the first duct 91 when the upper member 88 is combined with the lower member 89 and the intake-side member 86. The first duct forming section 881 extends from the first centrifugal fan 81B in the directions +X and −Y, further extends substantially in parallel to the direction −Y, and then deflects in the direction +X.

The first outlet 882 is provided at the end opposite from the portion, of first duct forming section 881, that is coupled to the first centrifugal fan 81B, and passes through the upper member 88 in the direction +Z. The first outlet 882 is disposed at a position shifted in the direction −Y from the blue light modulator 65B.

The cooling gas delivered from the first centrifugal fan 81B flows through the first duct 91 formed by the first duct forming section 881 of the upper member 88 and the lower member 89, and further flows in the direction +Z via the first outlet 882 along the blue light modulator 65B.

The branch section 883 is a portion that branches off the first duct 91 in the direction −Z. A portion of the cooling gas flowing through the first duct 91 flows into the branch section 883.

The branch outlet 884 is provided at a portion, of the branch section 883, that faces the direction −Z. The branch outlet 884 delivers the cooling gas having flowed into the branch section 883 from the first duct 91 to the optical parts of the image formation apparatus 6, for example, the polarization converter that is not shown but constitutes the homogenizer 62, to cool the optical parts.

The second duct forming section 885 along with the second duct forming section 873 forms the second duct 92 when combined with the lower member 89, the intake-side member 86, and the delivery-side member 87. The second duct forming section 885 bends in the direction −Z from the portion where the second duct forming section 885 is coupled to the second duct forming section 873 and then extends in the direction −Y.

The second outlet 886 is provided at the end, of the second duct forming section 885, that is opposite from the portion where the second duct forming section 885 is coupled to the second duct forming section 873, and passes through the upper member 88 in the direction +Z. The second outlet 886 is disposed at a position shifted in the direction −Z from the red light modulator 65R.

The cooling gas delivered from the second centrifugal fan 81R flows through the portion, of the second duct 92, that is formed by the second duct forming section 873, and then flows in the direction −Z along the second duct forming section 885. The cooling gas then flows in the direction −Y, and further flows via the second outlet 886 in the direction +Z along the red light modulator 65R.

The third duct forming section 887 forms the third duct 93 when combined with the lower member 89 and the intake-side member 86. The third duct forming section 887 extends in the direction −Y from the third centrifugal fan 81G.

The third outlet 888 is provided at the end, of the third duct forming section 887, that is opposite from the portion where the third duct forming section 887 is coupled to the third centrifugal fan 81G, and passes through the upper member 88 in the direction +Z. The third outlet 888 is disposed at a position shifted in the direction −Z from the green light modulator 65G.

The cooling gas delivered from the third centrifugal fan 81G flows through the third duct 93 formed by the third duct forming section 887 of the upper member 88 and the lower member 89, and further flows via the third outlet 888 in the direction +Z along the green light modulator 65G.

The first centrifugal fan 81B thus causes the air outside the projector 1 sucked via the air filter 226 to flow as the cooling gas to the blue light modulator 65B via the first duct 91.

The second centrifugal fan 81R causes the air outside the projector 1 sucked via the air filter 226 to flow as the cooling gas to the red light modulator 65R via the second duct 92.

The third centrifugal fan 81G causes the air outside the projector 1 sucked via the air filter 226 to flow as the cooling gas to the green light modulator 65G via the third duct 93.

Channel Length of Each Duct

The amount of heat generated by the green light modulator 65G is the largest of the amounts of heat generated by the three light modulators 65, and the amount of heat generated by the red light modulator 65R is the smallest of the amounts of heat generated by the three light modulators 65. That is, out of the three light modulators 65, the green light modulator 65G is a light modulator required to perform the largest amount of cooling, and the red light modulator 65R is a light modulator required to perform the smallest amount of cooling.

Therefore, in the present embodiment, setting the efficiency at which the cooling gas is caused to flow to the green light modulator 65G to be greater than the efficiency at which the cooling gas is caused to flow to the other light modulators 65 increases the cooling efficiency of the green light modulator 65G as compared with the cooling efficiency of the other light modulators 65B and 65R.

Specifically, the cooling gas channel length of the third duct 93, which is provided in accordance with the green light modulator 65G required to perform the largest amount of cooling, is shorter than the cooling gas channel length of the first duct 91, which is provided in accordance with the blue light modulator 65B, and the cooling gas channel length of the second duct 92, which is provided in accordance with the red light modulator 65R.

Furthermore, the cooling gas channel length of the second duct 92, which is provided in accordance with the red light modulator 65R required to perform the smallest amount of cooling, is longer than the cooling gas channel length of the first duct 91, which is provided in accordance with the blue light modulator 65B.

As described above, the centrifugal fans 81B, 81R, and 81G have the same specifications, and operate at the same rotational speed per unit time.

Other Configurations of Cooling Apparatus

The cooling apparatus 8 includes the light source fan 90, which is provided in the exterior enclosure 2 in accordance with the introduction port 223 of the bottom surface 22, as shown in FIGS. 4 and 5.

The light source fan 90 is so disposed at a position shifted in the direction −Z from the lower member 89 that an intake surface 901 faces the direction −Z, as shown in FIG. 13. That is, the intake surface 901 faces the air filter 2231. The light source fan 90 sucks the air outside the exterior enclosure 2 as the cooling gas via the air filter 2231 provided at the introduction port 223. The light source fan 90 delivers the cooling gas in the direction −X via an outlet 902, which faces the direction −X, toward the heat sink 513 of the light source apparatus 5. The heat sink 513 is thus cooled, and the light source 502 is in turn cooled.

The cooling gas having cooled the heat sink 513 is discharged out of the exterior enclosure 2 via the opening 251 provided in the left side surface 25.

Effects of Embodiment

The projector 1 according to the present embodiment described above provides the following effects.

The projector 1 includes the light source apparatus 5, the image formation apparatus 6, the projection optical apparatus 7, and the cooling apparatus 8. The light source apparatus 5 outputs the light containing the blue light LB as the first color light, the red light LR as the second color light, and the green light LG as the third color light. The image formation apparatus 6 includes the blue light modulator 65B, the red light modulator 65R, the green light modulator 65G, and the color combiner 66. The blue light modulator 65B corresponds to the first light modulator and modulates the blue light LB as the first color light. The red light modulator 65R corresponds to the second light modulator and modulates the red light LR as the second color light. The green light modulator 65G corresponds to the third light modulator and modulates the green light LG as the third color light. The color combiner 66 combines the modulated blue light LB, red light LR, and green light LG with one another and outputs the resultant image light. The projection optical apparatus 7 includes the optical path changer 73. The image light enters the projection optical apparatus 7 in the direction +X, which is the first direction, from the image formation apparatus 6. The projection optical apparatus 7 guides the incident image light along the direction +X, and after the optical path changer 73 changes the direction of the optical path of the image light to the direction +Y, which is the second direction, which intersects with the direction +X, the projection optical apparatus 7 projects the image light.

The cooling apparatus 8 includes the first duct 91, the second duct 92, the third duct 93, the first centrifugal fan 81B, the second centrifugal fan 81R, and the third centrifugal fan 81G.

The first duct 91 is provided in accordance with the blue light modulator 65B. The first centrifugal fan 81B has the intake surface 81B2 and delivers the cooling gas into the first duct 91.

The second duct 92 is provided in accordance with the red light modulator 65R. The second centrifugal fan 81R has the intake surface 81R2 and delivers the cooling gas into the second duct 92.

The third duct 93 is provided in accordance with the green light modulator 65G. The third centrifugal fan 81G has the intake surface 81G2 and delivers the cooling gas into the third duct 93.

The first centrifugal fan 81B, the second centrifugal fan 81R, and the third centrifugal fan 81G are disposed in the region defined by the image formation apparatus 6 and the projection optical apparatus 7 in such a way that the angles between the imaginary planes VS1, VS2 defined by the directions +X and +Y and the intake surfaces 81B2, 81R2, 81G2 are greater than or equal to 0° but smaller than or equal to 45°. The second centrifugal fan 81R is disposed at a position shifted from the first centrifugal fan 81B in the direction +Z, which is the third direction, which intersects with the directions +X and +Y. A portion of the second duct 92 overlaps with a portion of the first centrifugal fan 81B when viewed in the direction +Z.

The configuration described above, in which the centrifugal fans 81B, 81R, and 81G are disposed in the region defined by the image formation apparatus 6 and the projection optical apparatus 7, can contribute to reduction in the size of the projector 1 in the directions +X and +Y.

Further, the second centrifugal fan 81R is disposed at a position shifted in the direction +Z from the first centrifugal fan 81B, and a portion of the second duct 92 overlaps with a portion of the first centrifugal fan 81B when viewed in the direction +Z. The centrifugal fans 81B, 81R, and 81G and the ducts 91 to 93 can therefore be disposed in a compact arrangement, whereby the centrifugal fans 81B, 81R, and 81G and the ducts 91 to 93 have a small footprint in the plane XY. In the configuration described above, there is no need to bend the second duct 92 in such a way that a portion of the second duct 92 does not overlap with a portion of the first centrifugal fan 81B when viewed in the direction +Z. The cooling gas channel length of the second duct 92 thus increases and can therefore suppress an increase in the footprint of each of the centrifugal fans 81B, 81R, and 81G and the ducts 91 to 93.

Furthermore, the centrifugal fans 81B, 81R, and 81G are so oriented that the angles between the imaginary planes VS1, VS2 and the intake surfaces 81B2, 81R2, 81G2 are greater than or equal to 0° but smaller than or equal to 45°. The vibration that propagates from the centrifugal fans 81B, 81R, and 81G can therefore be suppressed, resulting in reduction in noise produced when the centrifugal fans 81B, 81R, and 81G are driven.

Therefore, the footprint of the projector 1 can be reduced, and the vibration and noise produced by the projector 1 can be reduced.

In the projector 1, the second centrifugal fan 81R is disposed at a position shifted in the direction +Y from the first centrifugal fan 81B.

According to the configuration described above, the second centrifugal fan 81R is disposed at a position shifted in the directions +Z and +Y from the first centrifugal fan 81B. The first centrifugal fan 81B and the second centrifugal fan 81R can therefore be disposed within a small range in the direction +X.

In the projector 1, a portion of the second centrifugal fan 81R overlaps with a portion of the first centrifugal fan 81B when viewed in the direction +Z.

According to the configuration described above, the range over which the second centrifugal fan 81R and the first centrifugal fan 81B are disposed in the direction +Y can be smaller than the range in a case where a portion of the second centrifugal fan 81R does not overlap with a portion of the first centrifugal fan 81B when viewed in the direction +Z.

In the projector 1, the amount of heat generated by the blue light modulator 65B and the amount of heat generated by the green light modulator 65G are each greater than the amount of heat generated by the red light modulator 65R. The cooling gas channel length of the first duct 91 and the cooling gas channel length of the third duct 93 are each shorter than the cooling gas channel length of the second duct 92.

According to the configuration described above, loss of the cooling gas flowing to the blue light modulator 65B and the green light modulator 65G can be reduced, and the cooling gas is readily allowed to flow to the blue light modulator 65B and the green light modulator 65G. The blue light modulator 65B and the green light modulator 65G, which each generate a greater amount heat than the red light modulator 65R, can therefore be cooled at improved efficiency.

In the projector 1, the cooling apparatus 8 includes the fourth centrifugal fan 81L. The fourth centrifugal fan 81L is disposed in the region defined by the image formation apparatus 6 and the projection optical apparatus 7, and delivers the cooling gas to the projection optical apparatus 7, which is a cooling target.

According to the configuration described above, the four centrifugal fans 81B, 81R, 81G, and 81L can be disposed in a compact arrangement, and the projection optical apparatus 7 can be cooled by the cooling gas delivered from the fourth centrifugal fan 81L.

In the projector 1, a portion of the fourth centrifugal fan 81L does not overlap with the first centrifugal fan 81B, the second centrifugal fan 81R, or the third centrifugal fan 81G when viewed in the direction +Z.

According to the configuration described above, the fourth centrifugal fan 81L can be disposed in a dead space where the fourth centrifugal fan 81L does not overlap with the centrifugal fan 81B, 81R, or 81G when viewed in the direction +Z. Therefore, even when the fourth centrifugal fan 81L is disposed in the region defined by the image formation apparatus 6 and the projection optical apparatus 7, an increase in the footprint of the centrifugal fans 81B, 81R, 81G, and 81L can be suppressed.

In the projector 1, the fourth centrifugal fan 81L is smaller than the largest one of the first centrifugal fan 81B, the second centrifugal fan 81R, and the third centrifugal fan 81G. The intake surface 81L2 of the fourth centrifugal fan 81L intersects with the imaginary plane VS3 parallel to the plane XY.

According to the configuration described above, the footprint of the fourth centrifugal fan 81L, which is smaller than the largest one of the first centrifugal fan 81B, the second centrifugal fan 81R, and the third centrifugal fan 81G, can be further reduced. The footprint of the centrifugal fans 81B, 81R, 81G, and 81L can thus be reduced, whereby the footprint of the projector 1 can be reduced.

In the projector 1, the fourth centrifugal fan 81L causes the cooling gas to flow to the projection optical apparatus 7. In detail, the fourth centrifugal fan 81L delivers the cooling gas to the end, of the projection optical apparatus 7, that faces the direction +Y to cool the enlarging reflection member 75 of the projection optical apparatus 7.

According to the configuration described above, the enlarging reflection member 75 can be cooled by the cooling gas caused to flow by the fourth centrifugal fan 81L. The projection optical apparatus 7 can therefore project the image light in a stable manner.

The projector 1 includes the exterior enclosure 2, which houses the light source apparatus 5, the image formation apparatus 6, the projection optical apparatus 7, and the cooling apparatus 8. The exterior enclosure 2 corresponds to the enclosure according to the present disclosure. The exterior enclosure 2 has the introduction port 225, via which a gas outside the exterior enclosure 2 is introduced into the exterior enclosure 2, and the air filter 226 provided at the introduction port 225. The introduction port 225 corresponds to the first introduction port, and the air filter 226 corresponds to the first filter. The first centrifugal fan 81B, the second centrifugal fan 81R, the third centrifugal fan 81G, and the fourth centrifugal fan 81L suck a gas outside the exterior enclosure 2 via the air filters 226.

The suction force produced by the fourth centrifugal fan 81L to suck the cooling gas is smaller than the cooling gas suction force produced by the centrifugal fan that produces the largest cooling gas suction force out of the first centrifugal fan 81B, the second centrifugal fan 81R, and the third centrifugal fan 81G.

The cooling apparatus 8 includes the intake duct 869 provided in the intake-side member 86. The air intake duct 869 is a duct that couples the air filter 226 to the fourth centrifugal fan 81L independently of the first centrifugal fan 81B, the second centrifugal fan 81R, and the third centrifugal fan 81G.

If the intake duct 869 is not present, the gas having passed through the air filter 226 is likely to be sucked by the first centrifugal fan 81B, the second centrifugal fan 81R, and the third centrifugal fan 81G, so that the amount of gas flowing to the fourth centrifugal fan 81L is likely to decrease.

In contrast, the intake duct 869 allows the gas having passed through the air filter 226 to reliably flow to the fourth centrifugal fan 81L, which delivers a smaller amount of cooling gas than the amounts of cooling gas delivered by the other centrifugal fans 81B, 81R, and 81G, that is, which sucks a smaller amount of cooling gas than the amounts of cooling gas sucked by the other centrifugal fans 81B, 81R, and 81G.

In the projector 1, the exterior enclosure 2 has the introduction port 223 as the second introduction port, and the air filter 2231 as the second filter. The introduction port 223 introduces a gas outside the exterior enclosure 2 into the exterior enclosure 2. The air filter 2231 is provided at the introduction port 223. The cooling apparatus 8 includes the light source fan 90, which delivers the cooling gas to the light source apparatus 5. The intake surface 901 of the light source fan 90 faces the air filter 2231 in the direction +Z.

According to the configuration described above, the light source fan 90 allows the cooling gas sucked via the air filter 2231 to flow to the light source apparatus 5. Since the light source fan 90 is provided at a position different from those of the centrifugal fans 81B, 81R, 81G, and 81L, the light source fan 90 does not overlap with the centrifugal fan 81B, 81R, 81G, or 81L when viewed in the direction +Z. Therefore, even when the light source fan 90 is provided, an increase in the dimension of the projector 1 in the direction +Z can be suppressed.

The projector 1 includes the left loudspeaker SPL provided at the side opposite from the projection optical apparatus 7 in the region defined by the image formation apparatus 6 and the projection optical apparatus 7 when viewed in the direction +Z. The first centrifugal fan 81B, the second centrifugal fan 81R, the third centrifugal fan 81G, and the fourth centrifugal fan 81L are disposed at positions shifted in the direction +X from the left loudspeaker SPL.

The configuration described above can suppress malfunction of the centrifugal fans 81B, 81R, 81G, and 81L due to the magnetic field generated when the left loudspeaker SPL operates.

Variations of Embodiment

The present disclosure is not limited to the embodiment described above, and variations, improvements, and other modifications to the extent that the advantage of the present disclosure is achieved fall within the scope of the present disclosure.

First Variation

In the projector 1 described above, it is assumed that the intake surfaces 81B2 and 81R2 of the first centrifugal fan 81B and the second centrifugal fan 81R, which partially overlap with each other when viewed in the direction +Z, which is the third direction, are parallel to the imaginary planes VS1 and VS2, which are each the plane XY defined by the direction +X, which is the first direction, and the direction +Y, which is the second direction, but not necessarily. Out of the plurality of centrifugal fans that partially overlap with each other when viewed in the direction +Z, the intake surface of at least one of the centrifugal fans may intersect with the plane XY.

Figure 17:
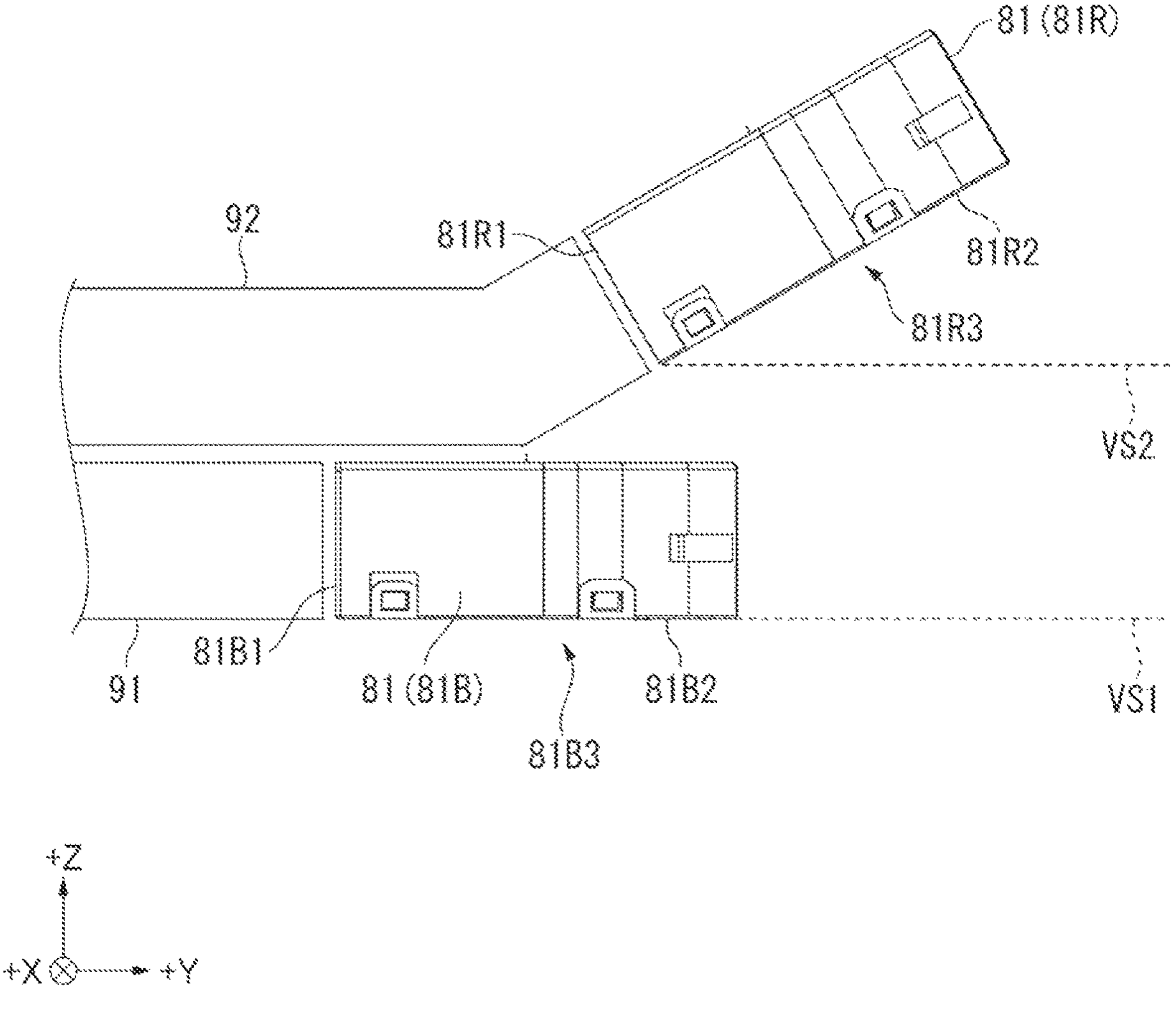
FIG. 17 is a side view showing the arrangement of the centrifugal fans in a variation of the embodiment.

FIG. 17 shows a variation of the arrangement of the first centrifugal fan 81B and the second centrifugal fan 81R.

For example, when a portion of the first centrifugal fan 81B and a portion of the second centrifugal fan 81R overlap with each other in the direction +Z as described above, the second centrifugal fan 81R disposed at a position shifted in the direction +Z from the first centrifugal fan 81B may be so disposed that the intake surface 81R2 inclines with respect to the imaginary plane VS2, which is the plane XY, as shown in FIG. 17.

In the example shown in FIG. 17, the first centrifugal fan 81B is so disposed that the intake surface 81B2 is parallel to the imaginary plane VS1, which is the plane XY, but not necessarily. The first centrifugal fan 81B may also be so disposed that the intake surface 81B2 intersects with the imaginary plane VS1. Instead, only the first centrifugal fan 81B may have an intake surface that intersects with the plane XY. Still instead, although not shown, the third centrifugal fan 81G may be so disposed that the intake surface 81G2 intersects with the plane XY, or that the intake surface 81G2 is parallel to the plane XY.

When an intake surface intersects with an imaginary plane parallel to the plane XY, the angle between the intake surface and the imaginary plane is preferably greater than 0° but smaller than or equal to 45°. That is, in conjunction with the arrangement of the centrifugal fans in the embodiment described above, the centrifugal fans are each preferably so disposed that the angle between the intake surface and the imaginary plane parallel to the plane XY is greater than or equal to 0° but smaller than or equal to 45°. The vibration produced when the centrifugal fans are driven can thus be effectively reduced.

On the other hand, when the angle between the intake surface and the imaginary plane parallel to the plane XY is greater than or equal to 0° but smaller than 90°, the vibration produced when the corresponding centrifugal fan is driven can be reduced as compared with a case where the angle between the intake surface and the plane XY is 90°.

Figure 18:
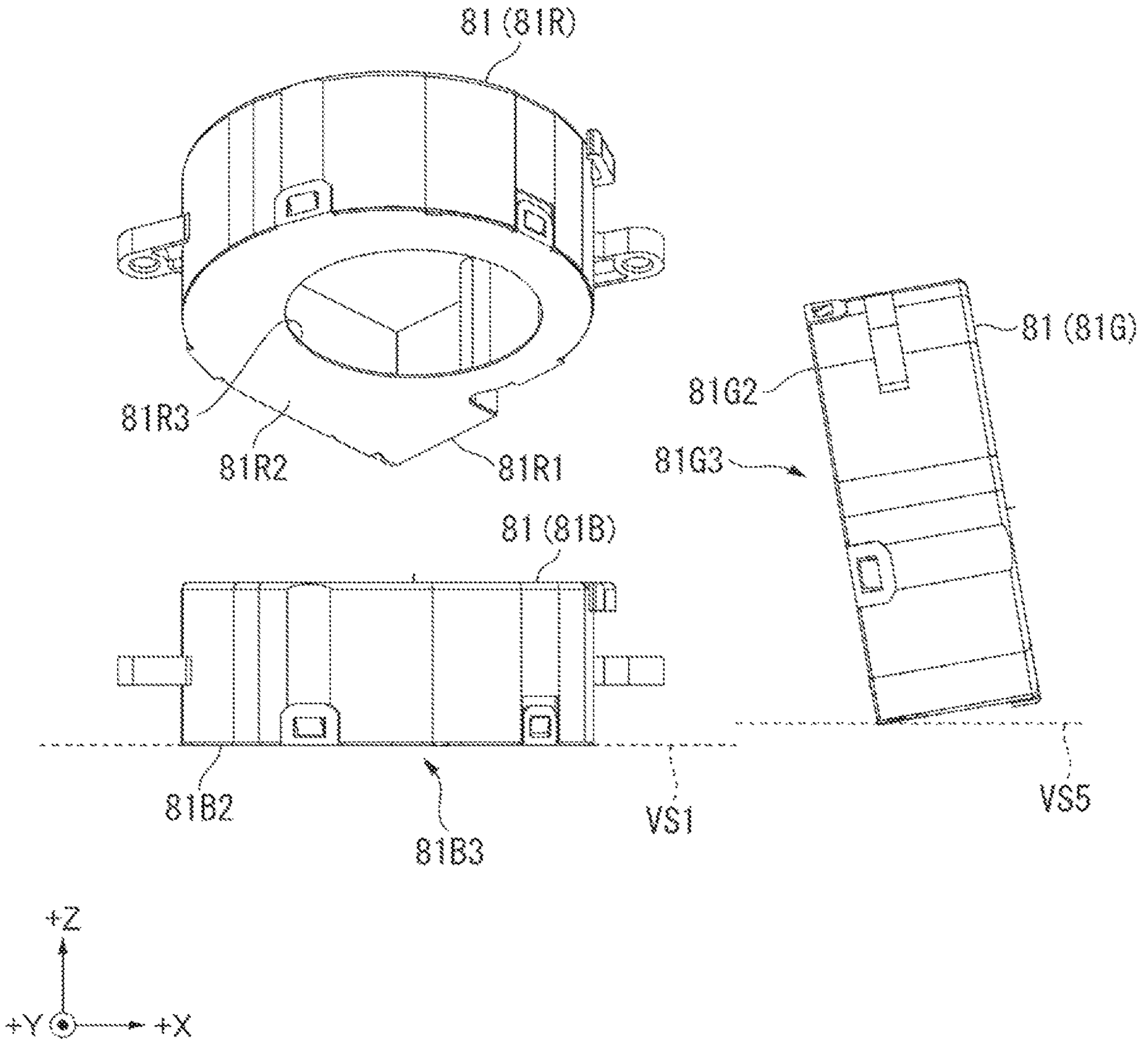
FIG. 18 is a side view showing the arrangement of the centrifugal fans in another variation of the embodiment.

FIG. 18 shows an example of the arrangement of the centrifugal fans 81B, 81R, and 81G viewed in the direction +Y. In detail, FIG. 18 shows an example of the arrangement of the third centrifugal fan 81G relative to the centrifugal fans 81B and 81R shown in FIG. 17.

For example, when the first centrifugal fan 81B and the second centrifugal fan 81R are so disposed that the angles between the intake surfaces 81B2, 81R2 and the imaginary plane parallel to the plane XY are greater than or equal to 0° but smaller than or equal to 45°, and a portion of the second duct 92 overlaps a portion of the first centrifugal fan 81B but does not overlap with a portion of the third centrifugal fan 81G when viewed in the direction +Z, the third centrifugal fan 81G may be so disposed that the angle between the intake surface 81G2 and an imaginary plane VS5 is greater than 45° but smaller than or equal to 90°, as shown in FIG. 18.

According to the configuration described above, the footprint of the three centrifugal fans 81B, 81R, and 81G in the plane XY can be reduced, whereby the size of the projector 1 can be reduced.

Only the third centrifugal fan 81G out of the centrifugal fans 81B, 81R, and 81G has an intersection angle between the intake surface and the imaginary plane VS5 being greater than 45° but smaller than or equal to 90°. The noise produced when the three centrifugal fans 81B, 81R, and 81G are driven can therefore be reduced as compared with a case where the three centrifugal fans 81B, 81R, and 81G each have an intersection angle between the intake surface and the imaginary plane parallel to the plane XY being greater than 45° but smaller than or equal to 90°.

To further reduce the vibration produced when the third centrifugal fan 81G is driven, the angle between the intake surface 81G2 and the imaginary plane parallel to the plane XY is preferably greater than 45° but smaller than 90°. When the angle between the intake surface 81G2 and the imaginary plane is smaller than 90° as described above, the vibration produced when the third centrifugal fan 81G is driven can be reduced as compared with a case where the angle between the intake surface 81G2 and the imaginary plane parallel to the plane XY is 90°.

When the third centrifugal fan 81G is so disposed that the angle between the intake surface 81G2 and the imaginary plane VS5 is greater than 45° but smaller than or equal to 90°, the third centrifugal fan 81G does not overlap with the first centrifugal fan 81B or the second centrifugal fan 81R when viewed in the direction +Z, which is the third direction, as shown in FIG. 18.

The configuration described above can suppress an increase in the dimension of the projector including the three centrifugal fans in the direction +Z. The size of the projector can therefore be reduced.

On the other hand, when the third centrifugal fan 81G overlaps with the first centrifugal fan 81B and the second centrifugal fan 81R when viewed in the direction +Z, the footprint of the centrifugal fans 81B, 81R, and 81G in the plane XY can be reduced. The area of the projector in the plane XY can therefore be reduced, and the size of the projector can in turn be reduced.

The second centrifugal fan 81R shown in FIGS. 17 and 18 is disposed so as to incline with respect to an imaginary plane parallel to the plane XY in such a way that the end, of the second centrifugal fan 81R, that faces the direction +Y is shifted in the direction +Z from the end facing the direction −Y. In the example shown in FIG. 18, it is assumed that the third centrifugal fan 81G is disposed so as to incline with respect to the imaginary plane parallel to the plane XY in such a way that the end, of the third centrifugal fan 81G, that faces the direction −X is shifted in the direction +Z from the end facing the direction +X. That is, the second centrifugal fan 81R and the third centrifugal fan 81G are disposed so as to incline with respect to the imaginary plane parallel to the plane XY, but not necessarily. When an intake surface intersects with an imaginary plane parallel to the plane XY, the intake surface may incline with respect to the imaginary plane in any direction.

For example, in the second centrifugal fan 81R, the intake surface 81R2 may incline with respect to the imaginary plane parallel to the plane XY in such a way that one of the end, of the second centrifugal fan 81R, that faces the direction +X and the end facing the direction −X is shifted in the direction +Z from the other end. Furthermore, for example, in the third centrifugal fan 81G, the intake surface 81G2 may incline with respect to the imaginary plane parallel to the plane XY in such a way that one of the end, of the third centrifugal fan 81G, that faces the direction +Y and the end facing the direction −Y is shifted in the direction +Z from the other end.

Second Variation

In the projector 1 described above, it is assumed that when viewed in the direction +Z, a portion of the second centrifugal fan 81R overlaps with a portion of the first centrifugal fan 81B, a portion of the second duct 92 overlaps with a portion of the first centrifugal fan 81B, and another portion of the second duct 92 overlaps with a portion of the third centrifugal fan 81G, but not necessarily. A portion of the first centrifugal fan 81B, a portion of the second centrifugal fan 81R, and a portion of the third centrifugal fan 81G may overlap with one another in the direction +Z.

Figure 19:
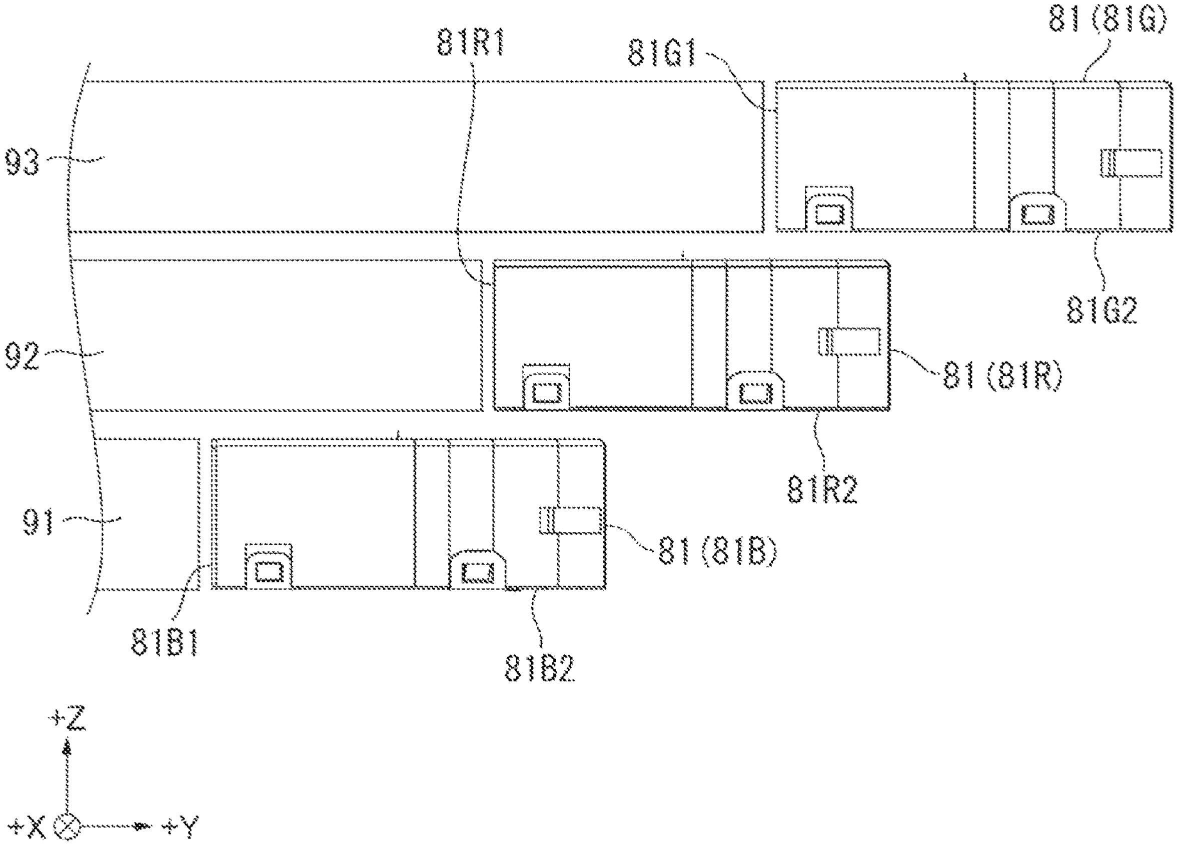
FIG. 19 is a side view showing the arrangement of the centrifugal fans in another variation of the embodiment.

FIG. 19 shows a variation of the arrangement of the centrifugal fans 81B, 81R, and 81G.

For example, the centrifugal fans 81B, 81R, and 81G may be so disposed that a portion of the first centrifugal fan 81B and a portion of the second centrifugal fan 81R overlap with each other, and another portion of the second centrifugal fan 81R and a portion of the third centrifugal fan 81G overlap with each other when viewed in the direction +Z, as shown in FIG. 19. In detail, the centrifugal fans 81B, 81R, and 81G may be so disposed that an end portion, of the first centrifugal fan 81B, that is opposite from the first duct 91 and an end portion, of the second centrifugal fan 81R, that faces the second duct 92 overlap with each other, and an end portion, of the second centrifugal fan 81R, that is opposite from the second duct 92 and an end portion, of the third centrifugal fan 81G, that faces the third duct 93 overlap with each other when viewed in the direction +Z.

In this case, the second duct 92 may overlap with the first centrifugal fan 81B, the first duct 91, and the third duct 93 when viewed in the direction +Z. The third duct 93 may overlap with the first centrifugal fan 81B, the first duct 91, the second centrifugal fan 81R, and the second duct 92 when viewed in the direction +Z.

Furthermore, although not shown, in the arrangement of a plurality of centrifugal fans that overlap with each other in the direction +Z, the centrifugal fans disposed in the first, second, and third stages are not limited to those described above. For example, the centrifugal fans disposed in the first, second, and third stages can be changed as appropriate as long as one of the centrifugal fans 81B, 81R, and 81G is disposed in the first stage, another centrifugal fan is disposed in the second stage, and the remaining centrifugal fan is disposed in the third stage.

Furthermore, the intake surface of at least one of the three centrifugal fans 81B, 81R, and 81G may intersect with the plane XY, as in the arrangement shown in the first variation described above.

Third Variation

Figure 20:
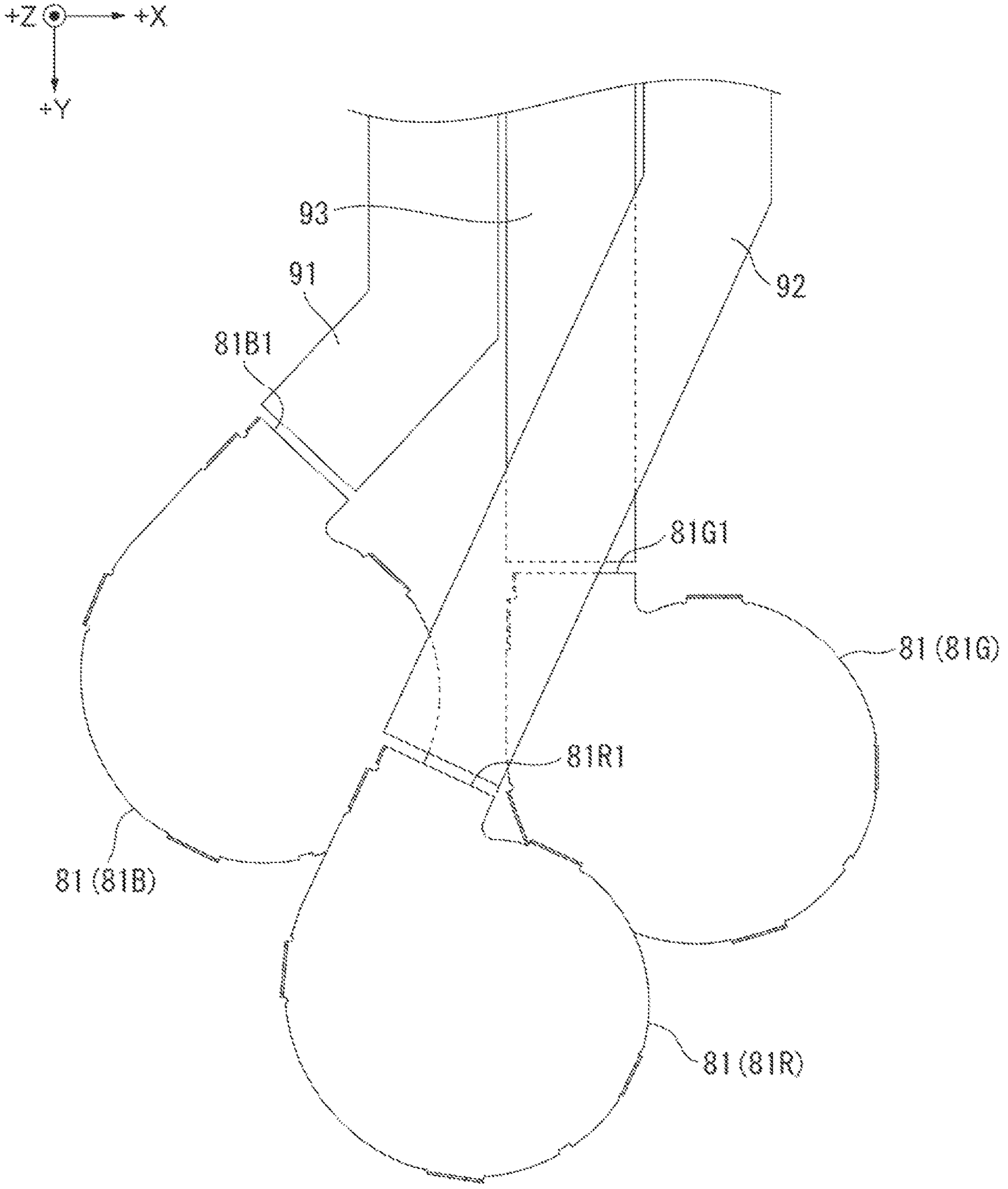
FIG. 20 is a plan view showing the arrangement of the centrifugal fans in another variation of the embodiment.

FIG. 20 is a plan view showing a variation of the arrangement the centrifugal fans 81B, 81R, and 81G.

In the projector 1 described above, it is assumed that the third centrifugal fan 81G is disposed at a position shifted in the direction +X from the first centrifugal fan 81B, and a portion of the second centrifugal fan 81R overlaps a portion of the first centrifugal fan 81B when viewed in the direction +Z, but not necessarily. A portion of the second centrifugal fan 81R may overlap with not only a portion of the first centrifugal fan 81B but a portion of the third centrifugal fan 81G when viewed in the direction +Z, as shown in FIG. 20.

In the example of the arrangement shown in FIG. 20, the second centrifugal fan 81R is disposed at a position shifted in the directions +Y and +Z from the first centrifugal fan 81B and the third centrifugal fan 81G. A portion, of the second centrifugal fan 81R, that faces the directions +X and −Y overlaps with a portion, of the first centrifugal fan 81B, that faces the directions −X and +Y, and a portion, of the second centrifugal fan 81R, that faces the directions +X and −Y overlaps with a portion, of the third centrifugal fan 81G, that faces the directions −X and +Y when viewed in the direction +Z. Furthermore, the second duct 92, through which the cooling gas delivered from the second centrifugal fan 81R flows, overlaps with a portion, of the first centrifugal fan 81B, that faces the direction +X when viewed in the direction +Z.

The second duct 92 may overlap with not only a portion of the first centrifugal fan 81B but a portion of the third centrifugal fan 81G, or may not overlap with the first centrifugal fan 81B but may overlap with a portion of the third centrifugal fan 81G when viewed in the direction +Z.

Furthermore, the intake surface of at least one of the three centrifugal fans 81B, 81R, and 81G may intersect with the plane X, as in the arrangement shown in the first variation described above.

That is, in the second variation, the second centrifugal fan 81R is disposed at a position shifted in the direction +Z from the third centrifugal fan 81G. A portion of the second duct 92 overlaps with not only a portion of the first centrifugal fan 81B but a portion of the third centrifugal fan 81G when viewed in the direction +Z.

According to the configuration described above, the centrifugal fans 81B, 81R, and 81G and the second duct 92 can be disposed in a compact arrangement, whereby the footprint of the centrifugal fans 81B, 81R, and 81G and the second duct 92 can be reduced. The footprint of the projector 1 can therefore be reduced.

In the second variation, the first centrifugal fan 81B and the third centrifugal fan 81G are disposed side by side in the direction +X out of the directions +X and +Y. A portion of the second centrifugal fan 81R overlaps with a portion of the first centrifugal fan 81B, and another portion of the second centrifugal fan 81R overlaps with a portion of the third centrifugal fan 81G when viewed in the direction +Z.

According to the configuration described above, the centrifugal fans 81B, 81R, and 81G can be disposed in a compact arrangement, whereby the footprint of the centrifugal fans 81B, 81R, and 81G can be reduced. The footprint of the projector 1 can therefore be reduced.

Fourth Variation

Figure 21:
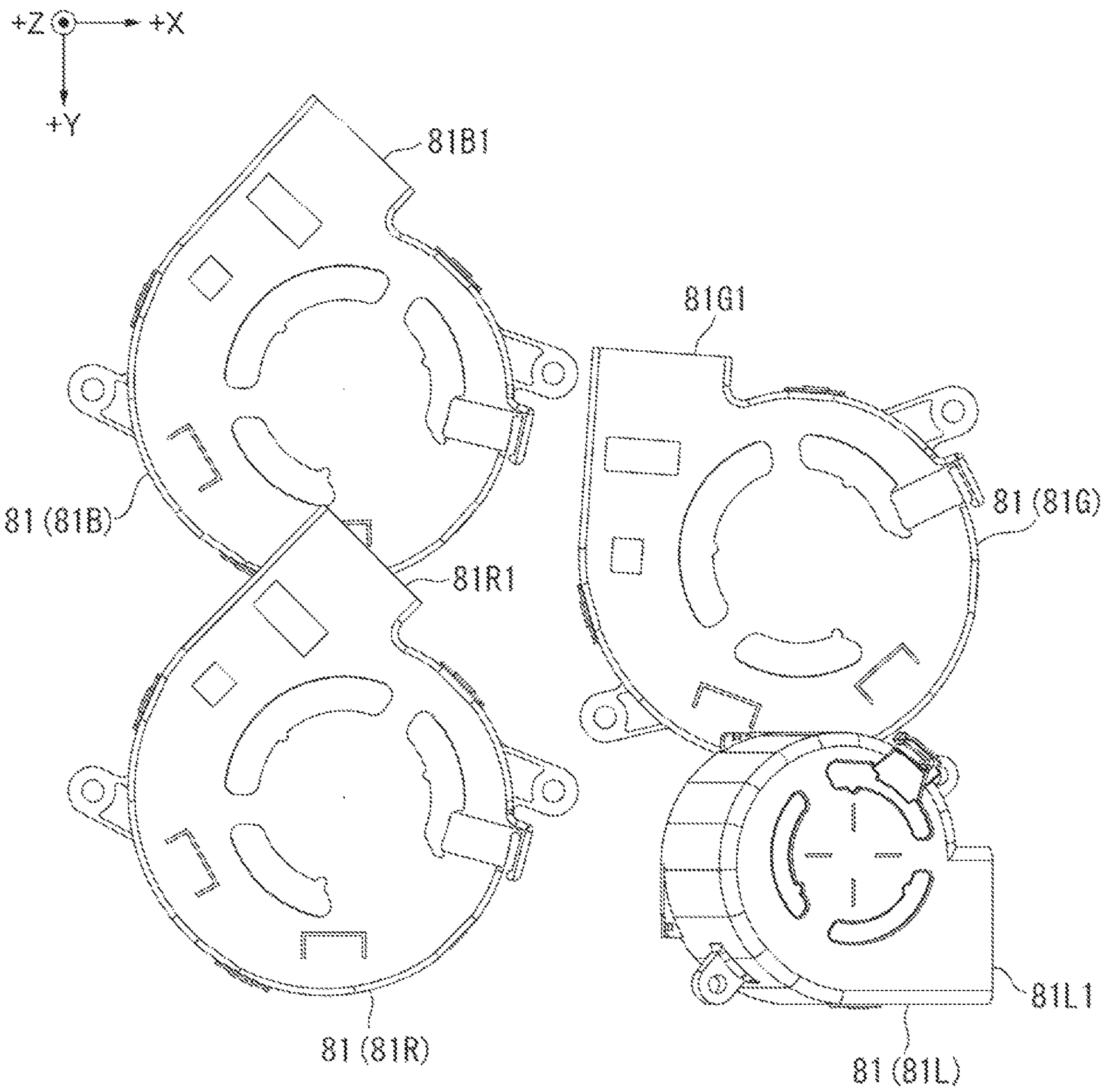
FIG. 21 is a plan view showing the arrangement of the centrifugal fans in another variation of the embodiment.

FIG. 21 is a plan view showing a variation of the arrangement of the centrifugal fans 81B, 81R, 81G, and 81L.

In the projector 1 described above, the fourth centrifugal fan 81L is disposed at a position where the fourth centrifugal fan 81L does not overlap with the first centrifugal fan 81B, the second centrifugal fan 81R, or the third centrifugal fan 81G when viewed in the direction +Z, but not necessarily. For example, the fourth centrifugal fan 81L may be disposed at a position where a portion of the fourth centrifugal fan 81L overlaps with a portion of the third centrifugal fan 81G when viewed in the direction +Z, as shown in FIG. 21.

That is, a portion of the fourth centrifugal fan 81L may overlap with a portion of at least one of the first centrifugal fan 81B, the second centrifugal fan 81R, and the third centrifugal fan 81G when viewed in the direction +Z.

Although not shown, the fourth centrifugal fan 81L may be so disposed that the intake surface 81L2 is parallel to the plane XY. When the intake surface 81L2 intersects with the plane XY, the angle between the intake surface 81L2 and the plane XY is preferably greater than 0° but smaller than or equal to 45°.

That is, in the fourth variation, a portion of the fourth centrifugal fan 81L overlaps with a portion of at least one of the first centrifugal fan 81B, the second centrifugal fan 81R, and the third centrifugal fan 81G when viewed in the direction +Z.

According to the configuration described above, even when the fourth centrifugal fan 81L is provided, the footprint of the centrifugal fans 81B, 81R, 81G, and 81L can be reduced. The footprint of the projector 1 can therefore be reduced.

In the example shown in FIG. 20, it is assumed that the centrifugal fan that overlaps with the fourth centrifugal fan 81L when viewed in the direction +Z is the third centrifugal fan 81G, but not necessarily. The centrifugal fan that overlaps with the fourth centrifugal fan 81L when viewed in the direction +Z may be at least one of the first centrifugal fan 81B and the second centrifugal fan 81R. Furthermore, the fourth centrifugal fan 81L may be disposed so as to overlap with a plurality of centrifugal fans when viewed in the direction +Z.

Other Variations

In the embodiment described above, it is assumed that the first color light is the blue light LB, that the second color light is the red light LR, and that the third color light is the green light LG. It is further assumed that the blue light modulator 65B, which modulates the blue light LB, is the first light modulator, that the red light modulator 65R, which modulates the red light LR, is the second light modulator, and that the green light modulator 65G, which modulates the green light LG, is the third light modulator by way of example, but not necessarily. For example, the second color light may be one of the blue light and the green light. That is, the second light modulator, to which the second duct guides the cooling gas, may be the blue light modulator that modulates the blue light or the green light modulator that modulates the green light.

In the embodiment described above, it is assumed that a portion of the second centrifugal fan 81R overlaps with a portion of the first centrifugal fan 81B when viewed in the direction +Z, but not necessarily. A portion of the second centrifugal fan 81R may not overlap with the first centrifugal fan 81B when viewed in the direction +Z.

When portions of a plurality of centrifugal fans overlap with each other when viewed in the direction +Z, the centrifugal fans preferably overlap with each other to the extent that the intake port of each of the centrifugal fans is not blocked by the other centrifugal fans.

According to the embodiment described above, it is assumed that the second centrifugal fan 81R is disposed at a position shifted in the directions +Z and +Y from the first centrifugal fan 81B, but not necessarily. The second centrifugal fan 81R may instead be disposed at a position shifted in the directions +Z and −Y from the first centrifugal fan 81B. The second centrifugal fan 81R may still instead be disposed at a position shifted in the direction −Z from the first centrifugal fan 81B.

In the embodiment described above, it is assumed that a portion of the second duct 92 overlaps with the third centrifugal fan 81G when viewed in the direction +Z, but not necessarily. A portion of the second duct 92 may not overlap with a portion of the third centrifugal fan 81G when viewed in the direction +Z.

It is assumed that the third centrifugal fan 81G is disposed at a position shifted in the direction +X from the first centrifugal fan 81B, but not necessarily. The third centrifugal fan 81G may be disposed at a position shifted in the direction −X from the first centrifugal fan 81B.

In the embodiment described above, it is assumed that the cooling gas channel length of the first duct 91, which guides the cooling gas to the blue light modulator 65B, which is the first light modulator, and the cooling gas channel length of the third duct 93, which guides the cooling gas to the green light modulator 65G, which is the third light modulator, are each shorter than the cooling gas channel length of the second duct 92, which guides the cooling gas to the red light modulator 65R, which is the second light modulator, but not necessarily. For example, when the amount of heat generated by the blue light modulator 65B and the amount of heat generated by the green light modulator 65G are each smaller than the amount of heat generated by the red light modulator 65R, the cooling gas channel length of the first duct 91 and the cooling gas channel length of the third duct 93 may not necessarily each be shorter than the cooling gas channel length of the second duct 92.

In the embodiment described above, it is assumed that the cooling apparatus 8 includes the fourth centrifugal fan 81L, which causes the cooling gas to flow to the end, of the projection optical apparatus 7, that faces the direction +Y. It is further assumed that the cooling apparatus 8 includes the light source fan 90, which causes the cooling gas to flow to the heat sink 513 of the light source apparatus 5, but not necessarily. The cooling apparatus 8 may include none of the fourth centrifugal fan 81L and the light source fan 90.

The cooling target to which the fourth centrifugal fan 81L causes the cooling gas to flow may not be the projection optical apparatus 7, and may instead be any other cooling target.

In the embodiment described above, it is assumed that the fourth centrifugal fan 81L is smaller than the other centrifugal fans 81B, 81R, and 81G, but not necessarily. The fourth centrifugal fan 81L may be larger than the other centrifugal fans 81B, 81R, and 81G, or may be as substantially large as the other centrifugal fans 81B, 81R, and 81G. The centrifugal fans 81B, 81R, 81G, and 81L may have sizes different from one another, or may have the same size.

In the embodiment described above, it is assumed that the intake surface 81L2 of the fourth centrifugal fan 81L intersects with the plane XY, but not necessarily. The fourth centrifugal fan 81L may be so disposed that the intake surface 81L2 is parallel to the plane XY.

It is assumed that the centrifugal fans 81B, 81R, and 81G have the same specifications, but not necessarily. At least one of the centrifugal fans 81B, 81R, and 81G may have a size different from the size of the other centrifugal fans, or may operate at a rotational speed per unit time different from the rotational speed at which the other centrifugal fans operate. At least one of the centrifugal fans 81B, 81R, and 81G may produce a cooling gas suction force different from the suction force produced by the other centrifugal fans, or may deliver an amount of cooling gas different from the amount of cooling gas delivered by the other centrifugal fans.

In the embodiment described above, it is assumed that the centrifugal fans 81B, 81R, 81G, and 81L suck a gas outside the exterior enclosure 2 via the air filter 226 as the first filter, but not necessarily. The air filter 226 may be omitted.

It is further assumed that the intake-side member 86, into which the gas having passed through the air filter 226 is introduced, includes the intake duct 869, but not necessarily. The intake duct 869 may be omitted.

In the embodiment described above, it is assumed that the light source fan 90 sucks a gas outside the exterior enclosure 2 via the air filter 2231, which is the second filter, but not necessarily. The air filter 2231 may be omitted.

In the embodiment described above, it is assumed that the centrifugal fans 81B, 81R, 81G, and 81L are disposed at positions shifted in the direction +X from the left loudspeaker SPL. The projector may, however, include no loudspeakers.

In the embodiment described above, it is assumed that the centrifugal fans 81B, 81R, 81G, and 81L suck the gas having passed through the air filter 226 disposed at the introduction port 225 provided in the bottom surface 22. The cooling gas sucked by the centrifugal fans 81B, 81R, 81G, and 81L may instead be a gas passing via an introduction port provided in another surface of the exterior enclosure 2 and introduced into the exterior enclosure 2.

In the embodiment described above, it is assumed that the projection optical apparatus 7 includes the enlarging reflection member 75, which enlarges the image light incident in the direction +Y and reflects the enlarged image light in the directions −Y and +Z, but not necessarily. The projection optical apparatus 7 may instead project the image light traveling in the direction +Y toward the projection receiving surface in the direction +Y.

In the embodiment described above, it is assumed that the light modulator 65 includes transmissive liquid crystal panels each having a light incident surface and a light exiting surface different from each other, but not necessarily. The light modulator 65 may include reflective liquid crystal panels each having a surface that serves as both the light incident surface and the light exiting surface. Furthermore, the light modulators employed by the projector described above may each be a light modulator using any component other than a liquid-crystal-based component and capable of modulating an incident luminous flux to form an image according to image information, such as a device using micromirrors, for example, a digital micromirror device (DMD).

Summary of Present Disclosure

The present disclosure will be summarized below as additional remarks.

A projector according to a first aspect of the present disclosure includes a light source apparatus that outputs light containing first color light, second color light, and third color light, an image formation apparatus including a first light modulator that modulates the first color light, a second light modulator that modulates the second color light, a third light modulator that modulates the third color light, and a color combiner that combines the modulated first color light, second color light, and third color light with one another into image light and outputs the image light, a projection optical apparatus that includes an optical path changer, receives the image light in a first direction from the image formation apparatus, guides the incident image light along the first direction, changes the direction of the optical path of the image light via the optical path changer to a second direction that intersects with the first direction, and then projects the image light, and a cooling apparatus. The cooling apparatus includes a first duct provided in accordance with the first light modulator, a first centrifugal fan that has an intake surface and delivers a cooling gas into the first duct, a second duct provided in accordance with the second light modulator, a second centrifugal fan that has an intake surface and delivers the cooling gas into the second duct, a third duct provided in accordance with the third light modulator, and a third centrifugal fan that has an intake surface and delivers the cooling gas into the third duct. The first, second, and third centrifugal fans are disposed in a region defined by the image formation apparatus and the projection optical apparatus and each so oriented that the angle between an imaginary plane defined by the first and second directions and the intake surface is greater than or equal to 00 but smaller than or equal to 45°. The second centrifugal fan is disposed at a position shifted from the first centrifugal fan in a third direction that intersects with the first and second directions. A portion of the second duct overlaps with a portion of the first centrifugal fan when viewed in the third direction.

The configuration described above, in which the centrifugal fans are disposed in the region defined by the image formation apparatus and the projection optical apparatus, can contribute to reduction in the size of the projector in the first and second directions.

The second centrifugal fan is disposed at a position shifted in the third direction from the first centrifugal fan, and a portion of the second duct overlaps with a portion of the first centrifugal fan when viewed in the third direction. The centrifugal fans and the ducts can therefore be disposed in a compact arrangement, whereby the centrifugal fans and the ducts have a small footprint in the plane defined by the first and second directions. In the configuration described above, there is no need to bend the second duct in such a way that a portion of the second duct does not overlap with a portion of the first centrifugal fan when the second duct extends in the direction from the second centrifugal fan toward the first centrifugal fan. An increase in the cooling gas channel length of the second duct can thus be suppressed.

Furthermore, the centrifugal fans are each so oriented that the angle between the imaginary plane described above and the intake surface is greater than or equal to 0° but smaller than or equal to 45°. The vibration that propagates from the centrifugal fans can therefore be suppressed, resulting in reduction in noise produced when the centrifugal fans are driven.

Therefore, the footprint of the projector can be reduced, and the vibration and noise produced by the projector can be reduced.

In the first aspect described above, the second centrifugal fan may be disposed at a position shifted in the second direction from the first centrifugal fan.

According to the configuration described above, the second centrifugal fan is disposed at a position shifted in the third and second directions from the first centrifugal fan. The first and second centrifugal fans can therefore be disposed within a small range in the first direction.

In the first aspect described above, a portion of the second centrifugal fan may overlap with a portion of the first centrifugal fan when viewed in the third direction.

According to the configuration described above, the range over which the first and second centrifugal fans are disposed in the second direction can be smaller than the range in the case where a portion of the second centrifugal fan does not overlap with a portion of the first centrifugal fan when viewed in the third direction.

In the first aspect described above, the second centrifugal fan may be disposed at a position shifted in the third direction from the third centrifugal fan, and a portion of the second duct may overlap with the third centrifugal fan when viewed in the third direction.

According to the configuration described above, a portion of the first centrifugal fan overlaps with a portion of the second centrifugal fan, and a portion of the second duct overlaps with a portion of the first centrifugal fan and a portion of the third centrifugal fan when viewed in the third direction. The centrifugal fans and the second duct can therefore be disposed in a compact arrangement, whereby the footprint of the centrifugal fans and the second duct can be reduced. The footprint of the projector can therefore be reduced.

In the first aspect described above, the first and third centrifugal fans may be disposed side by side in at least one of the first and second directions. A portion of the second centrifugal fan may overlap with a portion of the first centrifugal fan when viewed in the third direction, and another portion of the second centrifugal fan may overlap with a portion of the third centrifugal fan when viewed in the third direction.

According to the configuration described above, the first and third centrifugal fans are positioned so as not to overlap with each other when viewed in the third direction. In contrast, when a portion of the second centrifugal fan and a portion of the first centrifugal fan overlap with each other, and another portion of the second centrifugal fan and a portion of the third centrifugal fan overlap with each other when viewed in the third direction, the centrifugal fans can be disposed in a compact manner, whereby the footprint of the centrifugal fans can be reduced. The footprint of the projector can therefore be reduced.

In the first aspect described above, the amount of heat generated by the first light modulator and the amount of heat generated by the third light modulator may each be greater than the amount of heat generated by the second light modulator, and the cooling gas channel length of the first duct and the cooling gas channel length of the third duct may each be shorter than the cooling gas channel length of the second duct.

According to the configuration described above, the cooling gas channel length of each of the first and third ducts, which guide the cooling gas to the first and third light modulators, which each generate a large amount of heat, is shorter than the cooling gas channel length of the second duct, which guides the cooling gas to the second light modulator, which generates a small amount of heat. Therefore, the loss of the cooling gas flowing to the first and third light modulators can be reduced, and the cooling gas is readily allowed to flow to the first and third light modulators. The first and third light modulators, which each generate a large amount of heat, can therefore be cooled at improved efficiency.

In the first aspect described above, the cooling apparatus may include a fourth centrifugal fan that is disposed in the region defined by the image formation apparatus and the projection optical apparatus, and delivers the cooling gas to a cooling target.

According to the configuration described above, the four centrifugal fans can be disposed in a compact arrangement, and another cooling target can be cooled by the cooling gas delivered from the fourth centrifugal fan.

In the first aspect described above, a portion of the fourth centrifugal fan may not overlap with the first, second, or third centrifugal fan when viewed in the third direction.

According to the configuration described above, for example, when the fourth centrifugal fan is smaller than the other centrifugal fans, the fourth centrifugal fan can be disposed in a dead space where the fourth centrifugal fan does not overlap with a portion of any of the other centrifugal fans when viewed in the third direction. Therefore, even when the fourth centrifugal fan is disposed in the region described above, an increase in the footprint of the centrifugal fans can be suppressed.

In the first aspect described above, a portion of the fourth centrifugal fan may overlap with a portion of at least one of the first, second, and third centrifugal fans when viewed in the third direction.

According to the configuration described above, even when the fourth centrifugal fan is provided, the footprint of the centrifugal fans can be reduced, as in the case where the first and second centrifugal fans are provided. The footprint of the projector can therefore be reduced.

In the first aspect described above, the fourth centrifugal fan may be smaller than the largest one of the first, second, and third centrifugal fans, and an intake surface of the fourth centrifugal fan may intersect with the imaginary plane.

According to the configuration described above, the footprint of the fourth centrifugal fan, which is smaller than the largest one of the first, second, and third centrifugal fans, can be reduced. Therefore, even when the cooling apparatus includes the fourth centrifugal fan in addition to the first, second, and third centrifugal fans, the footprint of the centrifugal fans can be reduced, whereby the footprint of the projector can be reduced.

In the first aspect described above, the fourth centrifugal fan may cause the cooling gas to flow to the projection optical apparatus.

According to the configuration described above, even when the projection optical apparatus includes a part susceptible to heat, the part susceptible to heat can be cooled by the cooling gas caused to flow by the fourth centrifugal fan. The projection optical apparatus can therefore project the image light in a stable manner.

In the first aspect described above, the projector may include an enclosure that houses the light source apparatus, the image formation apparatus, the projection optical apparatus, and the cooling apparatus. The enclosure may have a first introduction port via which a gas outside the enclosure is introduced into the enclosure, and a first filter provided at the first introduction port. The first, second, third, and fourth centrifugal fans may suck the gas outside the enclosure via the first filter. The suction force produced by the fourth centrifugal fan to suck the cooling gas may be smaller than the cooling gas suction force produced by the centrifugal fan that produces the largest cooling gas suction force out of the first, second, and third centrifugal fans. The cooling apparatus may include a duct that couples the first filter to the fourth centrifugal fan independently of the first, second, and third centrifugal fans.

If the duct described above is not present, the gas having passed through the first filter is likely to be sucked by the first, second, and third centrifugal fans, so that the amount of gas flowing to the fourth centrifugal fan is likely to decrease.

In contrast, the configuration described above allows the gas having passed through the first filter to reliably flow to the fourth centrifugal fan, which delivers a smaller amount of cooling gas than the amounts of cooling gas delivered by the other centrifugal fan.

In the first aspect described above, the enclosure may have a second introduction port via which the gas outside the enclosure is introduced into the enclosure, and a second filter provided at the second introduction port. The cooling apparatus may include a light source fan that delivers the cooling gas to the light source apparatus. An intake surface of the light source fan may face the second filter in the third direction.

According to the configuration described above, the light source fan allows the cooling gas sucked via the second filter to flow to the light source apparatus. Since the light source fan is provided at a position different from those of the first, second, and third centrifugal fans, the light source fan does not overlap with the centrifugal fan when viewed in the third direction. Therefore, even when the light source fan is provided, an increase in the dimension of the projector in the third direction can be suppressed.

In the first aspect described above, the projector may include a loudspeaker provided in a portion opposite from the projection optical apparatus in the region described above, and the first, second, and third centrifugal fans may be disposed at positions shifted in the first direction from the loudspeaker when viewed in the third direction.

The configuration described above can suppress malfunction of the fans due to the magnetic field generated when the loudspeaker operates.

A projector according to a second aspect of the present disclosure includes a light source apparatus that outputs light containing first color light, second color light, and third color light, an image formation apparatus including a first light modulator that modulates the first color light, a second light modulator that modulates the second color light, a third light modulator that modulates the third color light, and a color combiner that combines the modulated first color light, second color light, and third color light with one another into image light and outputs the image light, a projection optical apparatus that includes an optical path changer, receives the image light in a first direction from the image formation apparatus, guides the incident image light along the first direction, changes the direction of the optical path of the image light via the optical path changer to a second direction that intersects with the first direction, and then projects the image light, and a cooling apparatus. The cooling apparatus includes a first duct provided in accordance with the first light modulator, a first centrifugal fan that has an intake surface and delivers a cooling gas into the first duct, a second duct provided in accordance with the second light modulator, a second centrifugal fan that has an intake surface and delivers the cooling gas into the second duct, a third duct provided in accordance with the third light modulator, and a third centrifugal fan that has an intake surface and delivers the cooling gas into the third duct. The first, second, and third centrifugal fans are disposed in a region defined by the image formation apparatus and the projection optical apparatus. The first and second centrifugal fans are so oriented that the angle between an imaginary plane defined by the first and second directions and the intake surface is greater than or equal to 0° but smaller than or equal to 45°. The third centrifugal fan is so oriented that the angle between the imaginary plane defined by the first and second directions and the intake surface is greater than 45° but smaller than or equal to 90°. The second centrifugal fan is disposed at a position shifted from the first centrifugal fan in a third direction that intersects with the first and second directions. A portion of the second duct overlaps with a portion of the first centrifugal fan when viewed in the third direction.

The configuration described above can provide the same effects as those provided by the projector according to the first aspect described above.

That is, the centrifugal fans are disposed in the region defined by the image formation apparatus and the projection optical apparatus and can therefore contribute to reduction in the size of the projector in the first and second directions. The second centrifugal fan is disposed at a position shifted in the third direction from the first centrifugal fan, and a portion of the second duct overlaps with a portion of the first centrifugal fan when viewed in the third direction. The centrifugal fans and the ducts can therefore be disposed in a compact arrangement, whereby the centrifugal fans and the ducts have a small footprint in the plane defined by the first and second directions. In the configuration described above, there is no need to bend the second duct in such a way that a portion of the second duct does not overlap with a portion of the first centrifugal fan when the second duct extends in the direction from the second centrifugal fan toward the first centrifugal fan. An increase in the cooling gas channel length of the second duct can thus be suppressed.

Furthermore, the third centrifugal fan is so oriented that the angle between the imaginary plane defined by the first and second directions and the intake surface is greater than 45° but smaller than or equal to 90°, and the first and second centrifugal fans are so oriented that the angle between the imaginary plane defined by the first and second directions and the intake surface is greater than or equal to 0° but smaller than or equal to 45°. The vibration that propagates from the centrifugal fans can therefore be suppressed, resulting in reduction in noise produced when the centrifugal fans are driven as compared with a case where the first, second, and third centrifugal fans are each so oriented that the angle between the imaginary plane described above and the intake surface is greater than 45° but smaller than or equal to 90°.

Therefore, the footprint of the projector can be reduced, and the vibration and noise produced by the projector can be reduced.

In the second aspect described above, the third centrifugal fan described above may not overlap with the first centrifugal fan and the second centrifugal fan when viewed in the third direction.

The configuration described above can suppress an increase in the dimension, in the third direction, of the projector including the first, second, and third centrifugal fans as compared with a case where the third centrifugal fan overlaps with the first and second centrifugal fans when viewed in the third direction. The size of the projector can therefore be reduced.

What is claimed is:

1. A projector comprising:

a light source apparatus that outputs light containing first color light, second color light, and third color light;

an image formation apparatus including a first light modulator that modulates the first color light, a second light modulator that modulates the second color light, a third light modulator that modulates the third color light, and a color combiner that combines the modulated first color light, second color light, and third color light with one another into image light and outputs the image light;

a projection optical apparatus that includes an optical path changer, receives the image light in a first direction from the image formation apparatus, guides the incident image light along the first direction, changes a direction of an optical path of the image light via the optical path changer to a second direction that intersects with the first direction, and then projects the image light; and a cooling apparatus, wherein the cooling apparatus includes a first duct provided in accordance with the first light modulator, a first centrifugal fan that has an intake surface through which an outside air flows into the first centrifugal fan and an outlet through which a cooling gas flows from the first centrifugal fan into the first duct, a second duct provided in accordance with the second light modulator, a second centrifugal fan that has an intake surface through which an outside air flows into the second centrifugal fan and an outlet through which a cooling gas flows from the second centrifugal fan into the second duct, a third duct provided in accordance with the third light modulator, and a third centrifugal fan that has an intake surface through which an outside air flows into the third centrifugal fan and an outlet through which a cooling gas flows from the third centrifugal fan into the third duct, the first, second, and third centrifugal fans are disposed in a region defined by the image formation apparatus and the projection optical apparatus and each so oriented that an angle between an imaginary plane defined by the first and second directions and their respective intake surface is greater than or equal to 0° but smaller than or equal to 45°, the second centrifugal fan is disposed at a position shifted from the first centrifugal fan in a third direction that intersects with the first and second directions, and a portion of the second duct and a portion of the outlet of the second centrifugal fan both overlap with a portion of the first centrifugal fan when viewed in the third direction.

2. The projector according to claim 1, wherein the second centrifugal fan is disposed at a position shifted in the second direction from the first centrifugal fan.

3. The projector according to claim 1, wherein the second centrifugal fan is disposed at a position shifted in the third direction from the third centrifugal fan, and a portion of the second duct overlaps with the third centrifugal fan when viewed in the third direction.

4. The projector according to claim 1, wherein the first and third centrifugal fans are disposed side by side in at least one of the first and second directions, another portion of the second centrifugal fan overlaps with a portion of the third centrifugal fan when viewed in the third direction.

5. The projector according to claim 1, wherein an amount of heat generated by the first light modulator and an amount of heat generated by the third light modulator are each greater than an amount of heat generated by the second light modulator, and a cooling gas channel length of the first duct and a cooling gas channel length of the third duct are each shorter than a cooling gas channel length of the second duct.

6. The projector according to claim 1, wherein the cooling apparatus includes a fourth centrifugal fan that is disposed in a region defined by the image formation apparatus and the projection optical apparatus, and delivers the cooling gas to a cooling target.

7. The projector according to claim 6, wherein a portion of the fourth centrifugal fan does not overlap with the first, second, or third centrifugal fan when viewed in the third direction.

8. The projector according to claim 6, wherein a portion of the fourth centrifugal fan overlaps with a portion of at least one of the first, second, and third centrifugal fans when viewed in the third direction.

9. The projector according to claim 6, wherein the fourth centrifugal fan is smaller than a largest one of the first, second, and third centrifugal fans, and an intake surface of the fourth centrifugal fan intersects with the imaginary plane.

10. The projector according to claim 6, wherein the fourth centrifugal fan causes the cooling gas to flow to the projection optical apparatus.

11. The projector according to claim 6, further comprising an enclosure that houses the light source apparatus, the image formation apparatus, the projection optical apparatus, and the cooling apparatus, wherein the enclosure has a first introduction port via which a gas outside the enclosure is introduced into the enclosure, and a first filter provided at the first introduction port, the first, second, third, and fourth centrifugal fans suck the gas outside the enclosure via the first filter, a suction force produced by the fourth centrifugal fan to suck the cooling gas is smaller than a cooling gas suction force produced by a centrifugal fan that produces a largest cooling gas suction force out of the first, second, and third centrifugal fans, and the cooling apparatus includes a duct that couples the first filter to the fourth centrifugal fan independently of the first, second, and third centrifugal fans.

12. The projector according to claim 11, wherein the enclosure has a second introduction port via which the gas outside the enclosure is introduced into the enclosure, and a second filter provided at the second introduction port, the cooling apparatus includes a light source fan that delivers the cooling gas to the light source apparatus, and an intake surface of the light source fan faces the second filter in the third direction.

13. The projector according to claim 1, further comprising a loudspeaker provided at a side across the region from the projection optical apparatus when viewed in the third direction, wherein the first, second, and third centrifugal fans are disposed at positions shifted in the first direction from the loudspeaker.

14. The projector according to claim 1, wherein the intake surface of the first centrifugal fan is parallel to the intake surface of the second centrifugal fan.

15. The projector according to claim 1, wherein the second centrifugal fan is disposed at a position shifted from the first centrifugal fan in both the second direction and a third direction that intersects with the first and second directions but not in the first direction.

16. A projector comprising:

a light source apparatus that outputs light containing first color light, second color light, and third color light;

an image formation apparatus including a first light modulator that modulates the first color light, a second light modulator that modulates the second color light, a third light modulator that modulates the third color light, and a color combiner that combines the modulated first color light, second color light, and third color light with one another into image light and outputs the image light;

a projection optical apparatus that includes an optical path changer, receives the image light in a first direction from the image formation apparatus, guides the incident image light along the first direction, changes a direction of an optical path of the image light via the optical path changer to a second direction that intersects with the first direction, and then projects the image light; and a cooling apparatus, wherein the cooling apparatus includes a first duct provided in accordance with the first light modulator, a first centrifugal fan that has an intake surface through which an outside air flows into the first centrifugal fan and an outlet through which a cooling gas flows from the first centrifugal fan into the first duct, a second duct provided in accordance with the second light modulator, a second centrifugal fan that has an intake surface through which an outside air flows into the second centrifugal fan and an outlet through which a cooling gas flows from the second centrifugal fan into the second duct, a third duct provided in accordance with the third light modulator, and a third centrifugal fan that has an intake surface through which an outside air flows into the third centrifugal fan and an outlet through which a cooling gas flows from the third centrifugal fan into the third duct, the first, second, and third centrifugal fans are disposed in a region defined by the image formation apparatus and the projection optical apparatus, the first and second centrifugal fans are each so oriented that an angle between an imaginary plane defined by the first and second directions and their respective intake surface is greater than or equal to 0° but smaller than or equal to 45°, wherein the angle formed between the imaginary plane and the intake surface of the first centrifugal fan is same as the angle formed between the imaginary plane and the intake surface of the second centrifugal fan, the third centrifugal fan is so oriented that an angle between the imaginary plane defined by the first and second directions and the intake surface of the third centrifugal fan is greater than 45° but smaller than or equal to 90°, the second centrifugal fan is disposed at a position shifted from the first centrifugal fan in a third direction that intersects with the first and second directions, and a portion of the second duct and a portion of the outlet of the second centrifugal fan both overlap with a portion of the first centrifugal fan when viewed in the third direction.

17. The projector according to claim 16, wherein the third centrifugal fan does not overlap with the first centrifugal fan and the second centrifugal fan when viewed in the third direction.

* * * * *